(12) United States Patent
Song

(10) Patent No.: US 11,978,495 B2
(45) Date of Patent: May 7, 2024

(54) SEMICONDUCTOR DEVICES

(71) Applicant: SK hynix Inc., Gyeonggi-do (KR)

(72) Inventor: Choung Ki Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 44 days.

(21) Appl. No.: 17/842,268

(22) Filed: Jun. 16, 2022

(65) Prior Publication Data

US 2023/0063533 A1    Mar. 2, 2023

Related U.S. Application Data

(60) Provisional application No. 63/239,930, filed on Sep. 1, 2021.

(30) Foreign Application Priority Data

Mar. 7, 2022    (KR) ........................ 10-2022-0029019

(51) Int. Cl.
*G11C 11/406*    (2006.01)
*G11C 11/408*    (2006.01)

(52) U.S. Cl.
CPC .... *G11C 11/40615* (2013.01); *G11C 11/4087* (2013.01)

(58) Field of Classification Search
CPC . G11C 11/40615; G11C 11/4087; G11C 7/22; G11C 11/4076; G11C 11/4082
See application file for complete search history.

(56) References Cited

U.S. PATENT DOCUMENTS 10,770,127 B2    9/2020 Shore et al.
2018/0174638 A1*    6/2018 Ku ...................... G11C 11/4087

* cited by examiner

*Primary Examiner* — Jay W. Radke
(74) *Attorney, Agent, or Firm* — IP & T GROUP LLP

(57) ABSTRACT

A semiconductor device includes an information update control circuit configured to generate a self-read pulse for a self-read operation, a self-write pulse for a self-write operation, and an information update section signal that is activated during an information update section when an active operation is performed, and a column control circuit configured to receive the self-read pulse and the self-write pulse, to generate a read column strobe pulse for outputting data or selection information data stored in a core circuit when the self-read operation is performed based on the self-read pulse or the read operation is performed according to the read pulse, and to generate a write column strobe pulse for storing the data or the selection information data in the core circuit when the self-write operation is performed based on the self-write pulse or the write operation is performed according to the write pulse.

31 Claims, 28 Drawing Sheets

243B

SEMICONDUCTOR DEVICES

CROSS-REFERENCE TO RELATED APPLICATIONS

The present application claims the priority of United States Provisional Application Ser. No. 63/239,930, filed on Sep. 1, 2021, and Korean patent application number 10-2022-0029019, filed on Mar. 7, 2022, which are both incorporated herein by reference in their entirety.

BACKGROUND

1. Technical Field

Embodiments of the present disclosure relate to semiconductor devices for storing information based on the number of times a word line is selected.

2. Related Art

Among memory semiconductor devices, DRAM has a phenomenon in which information stored in memory cells disappears over time, unlike static random access memory (SRAM) or flash memory. In order to prevent such a phenomenon, an operation of rewriting information stored in the cell is performed from the outside at regular time intervals, and this series of operations is called refresh. Refreshing is performed in such a way that data is sensed and amplified by activating a word line at least once within the retention time of each cell in a bank. Here, the retention time refers to a time during which data can be maintained in a cell without refreshing after writing some data in the cell.

SUMMARY

An embodiment of the present disclosure may provide a semiconductor device including an information update control circuit configured to generate a self-read pulse for a self-read operation, a self-write pulse for a self-write operation, and an information update section signal that is activated during an information update time interval when an active operation is performed, and a column control circuit configured to receive the self-read pulse and the self-write pulse to generate a read column strobe pulse for outputting data or selection information data stored in a core circuit when the self-read operation is performed based on the self-read pulse or when a read operation is performed according to a read pulse, and the column control circuit is configured to generate a write column strobe pulse for storing the data or the selection information data in the core circuit when the self-write operation is performed based on the self-write pulse or the write operation is performed according to a write pulse.

In addition, another embodiment of the present disclosure may provide a semiconductor device including a core circuit including a first cell block and a second cell block connected to word lines, a column control circuit configured to generate a read column strobe pulse for outputting data or selection information data stored in the core circuit when a self-read operation is performed based on an active pulse or when a read operation is performed according to a read pulse, and to generate a write column strobe pulse for storing the data or the selection information data in the core circuit when a self-write operation is performed based on the active pulse or when a write operation is performed according to a write pulse, and a column decoder configured to generate a first column selection signal for selecting at least one of first bit lines connected to the first cell block based on the read column strobe pulse, the write column strobe pulse, and an information update section signal, or to generate a second column selection signal for selecting at least one of second bit lines connected to the second cell block.

In addition, another embodiment of the present disclosure may provide a semiconductor device including an information update control circuit configured to generate a self-read pulse for a self-read operation, a self-write pulse for a self-write operation, and an information update section signal that is activated, during an information update section, based on a self-operation pulse generated at a time point when a preset time interval elapses from a time point when an active pulse is generated, and a column control circuit configured to receive the self-read pulse and the self-write pulse to generate a read column strobe pulse for outputting data or selection information data stored in a core circuit when the self-read operation is performed based on the self-read pulse or when a read operation is performed according to a read pulse, and to generate a write column strobe pulse for storing the data or the selection information data in the core circuit when the self-write operation is performed based on the self-write pulse or when a write operation is performed according to a write pulse.

DETAILED DESCRIPTION

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a section in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

"Logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level," the logic bit set of the signal may be set as the first logic bit set, and when the logic level of each of the two bits included in the signal is "logic low level, logic high level," the logic bit set of the signal may be set as the second logic bit set.

Various embodiments of the present disclosure will be described hereinafter in detail with reference to the accompanying drawings. However, the embodiments described herein are for illustrative purposes only and are not intended to limit the scope of the present disclosure.

Figure 1:
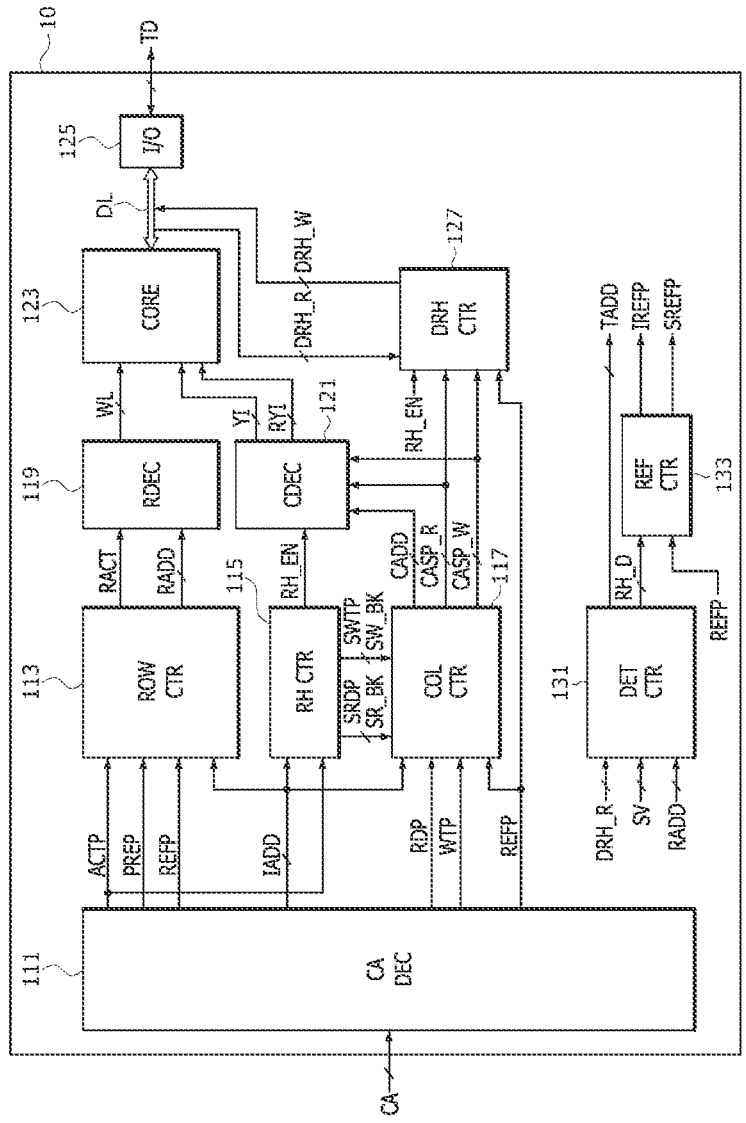
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As shown in FIG. 1, the semiconductor device 10 may include a control signal decoder (CADEC) 111, a row control circuit (ROW CTR) 113, an information update control circuit (RH CTR) 115, a column control circuit (COL CTR) 117, a row decoder (RDEC) 119, a column decoder (CDEC) 121, a core circuit (CORE) 123, an input/output circuit (I/O) 125, a data control circuit (DRH CTR) 127, a detection control circuit (DET CTR) 131, and a refresh control circuit (REF CTR) 133.

The control signal decoder 111 may receive an external control signal CA from an external device of the semiconductor device 10. The external device of the semiconductor device 10 may be a controller (311 of FIG. 25, 331 of FIG. 26, 1002 of FIG. 27, 2300 of FIG. 28) or a test device. The external control signal CA may include a command and an address for controlling internal operations including an active operation, a precharge operation, a read operation, a write operation, a refresh operation, or the like. The number of bits included in the external control signal CA may be variously set according to embodiments, and each of an active operation, a read operation, a write operation, and a refresh operation may be performed according to a logic bit set of the bits included in the external control signal CA. The control signal decoder 111 may decode the command included in the external control signal CA to generate an active pulse ACTP, a precharge pulse PREP, a refresh pulse REFP, a read pulse RDP, and a write pulse WTP. The active pulse ACTP may be generated for the active operation, the precharge pulse PREP may be generated for the precharge operation, and the refresh pulse REFP may be generated for the refresh operation. In addition, the read pulse RDP may be generated for the read operation, and the write pulse WTP may be generated for the write operation. The control signal decoder 111 may decode the address included in the external control signal CA to generate an internal address IADD. The internal address IADD may include a row address RADD and a column address CADD. The row address RADD may include addresses for selecting at least one of banks (not shown) included in the core circuit 123 and for selecting at least one of word lines WLs of cell blocks (171 and 173 of FIG. 9) included in the selected bank. The column address CADD may include addresses for selecting at least one of bit lines (BL<1:J+K> of FIG. 9) of e cell blocks (171 and 173 of FIG. 9) included in the bank.

The row control circuit 113 may receive the active pulse ACTP, the precharge pulse PREP, the refresh pulse REFP, and the internal address IADD. The row control circuit 113 may generate a row active signal RACT and a row address RADD based on the active pulse ACTP, the precharge pule PREP, the refresh pulse REFP, and the internal address IADD. The row control circuit 113 may generate an activated row active signal RACT when an active pulse ACTP is generated for an active operation, select at least one of the banks (not shown) included in the core circuit 123, and generate a row address RADD for selecting at least one of the word lines WLs of the cell blocks (171 and 173 of FIG. 9) included in the selected bank. The row control circuit 113 may deactivate the row active signal RACT when the precharge pulse PREP is generated for the precharge operation in a state in which an active operation is performed and the row active signal RACT is activated. The row control circuit 113 may generate an activated row active signal RACT when the refresh pulse REFP is generated for a refresh operation, and generate the row address RADD for sequentially refreshing all memory cells included in the core circuit 123. The row control circuit 113 may include an address counting circuit (not shown) that sequentially counts the row addresses RADD in the refresh operation. A method in which the row control circuit 113 generates the row address RADD in the refresh operation may be implemented in various ways according to embodiments.

The information update control circuit 115 may receive the active pulse ACTP and the internal address IADD from the control signal decoder 111. The information update control circuit 115 may generate a self-read pulse SRDP, a self-read bank address SRBK, a self-write pulse SWTP, a self-write bank address SWBK, and an information update section signal RHEN, based on the active pulse ACTP and the internal address IADD. The information update control circuit 115 may generate the self read pulse SRDP and the self read bank address SR_BK for a self read operation and the self write pulse SWTP and the self write bank address SW_BK for a self write operation when an active pulse ACTP is generated for an active operation. The information update control circuit 115 may generate the information update section signal RH_EN activated during an information update time interval set from a time the active pulse ACTP is generated to a time the self-read pulse SRDP for a self-read operation and the self-write pulse SWTP for a self-write operation are generated. The information update control circuit 115 may delay the active pulse ACTP by a first command pulse delay time to generate the self-read pulse SRDP, and may delay the self-read pulse SRDP by a second command pulse delay time to generate the self-write pulse SWTP. The information update control circuit 115 may delay the internal address IADD by a first address delay time to generate the self-read bank address SR_BK, and may delay the self-read bank address SR_BK by a second address delay time to generate the self-write bank address SW_BK. Each of the first command pulse delay time and the first address delay time may be set to row address to column address delay (tRCD), but this is only an example, and the present disclosure is not limited thereto. In addition, each of the second command pulse delay time and the second address delay section may be set to a time required to generate write data DRHW, by increasing a set value of read data DRH_R output from the core circuit 123 through the self-read operation, and to store the write data DRHW in the core circuit 123, but this is only an example, and the present disclosure is not limited thereto.

The column control circuit 117 may receive the internal address IADD, the read pulse RDP, the write pulse WTP, and the refresh pulse REFP from the control signal decoder 111, and may receive the self-read pulse SRDP, the self-read bank address SR_BK, the self-write pulse SWTP, and the self-write bank address SW_BK from the information update control circuit 115. The column control circuit 117 may generate a column address CADD, a read column strobe pulse CASP_R, and a write column strobe pulse CASP_W, based on the internal address IADD, the read pulse RDP, the write pulse WTP, the refresh pulse REFP, the self-read pulse SRDP, the self-read bank address SR_BK, the self-write pulse SWTP, and the self-write bank address SW_BK. The column control circuit 117 may generate the column address CADD based on the internal address IADD, and may generate the read column strobe pulse CASP_R based on the self-read pulse SRDP and the self-read bank address SR_BK when a self-read operation is performed according to the active operation. The read column strobe pulse CASP_R may include pulses respectively corresponding to the banks (not shown) included in the core circuit 123. The column control circuit 117 may generate a column address CADD based on the internal address IADD and may generate the write column strobe pulse CASP_W based on the self-write pulse SWTP and the self-write bank address SW_BK when a self-write operation is performed according to an active operation. The write column strobe pulse CASP_W may include pulses respectively corresponding to the banks (not shown) included in the core circuit 123. The column control circuit 117 may generate the write column strobe pulse CASP_W including pulses respectively corresponding to the banks (not shown) included in the core circuit 123, based on the refresh pulse REFP when a refresh operation is performed. When a read operation is performed, the column control circuit 117 may generate the column address CADD based on the internal address IADD, and may generate the read column strobe pulse CASP_R including pulses respectively corresponding to the banks (not shown) included in the core circuit 123, based on the read pulse RDP and the internal address IADD. The column control circuit 117 may generate the column address CADD based on the internal address IADD, and may generate the write column strobe pulse CASP_W including pulses respectively corresponding to the banks (not shown) included in the core circuit 123, based on the write pulse WTP and the internal address IADD when a write operation is performed.

The row decoder 119 may receive the row active signal RACT and the row address RADD from the row control circuit 113. The row decoder 119 may select at least one of the banks (not shown) included in the core circuit 123, based on the row active signal RACT and the row address RADD, and may select at least one of the word lines WLs of the cell blocks (171 and 173 of FIG. 9) included in the selected bank when an active operation or a refresh operation is performed.

The column decoder 121 may receive the information update section signal RH_EN from the information update control circuit 115, and may receive the column address CADD, the read column strobe pulse CASP_R, and the write column strobe pulse CASP_W from the column control circuit 117. The column decoder 121 may generate a first column selection signal YI based on the column address CADD when the read column strobe pulse CASP_R is generated in a state in which the read operation is performed and the information update section signal RH_EN is deactivated. The column decoder 121 may generate the first column selection signal YI based on the column address CADD when the write column strobe pulse CASP_W is generated in a state in which the write operation is performed and the information update section signal RH_EN is deactivated. The first column selection signal YI may include bits respectively corresponding to the bit lines (BL<1:J> of FIG. 9) to select at least one of the bit lines (BL<1:J> of FIG. 9) of the cell block (171 of FIG. 9). The column decoder 121 may generate a second column selection signal RYI based on the column address CADD when the read column strobe pulse CASP_R is generated in a state in which the self-read operation is performed according to the active operation and the information update section signal RH_EN is activated. The column decoder 121 may generate a second column selection signal RYI based on the column address CADD when the write column strobe pulse CASP_W is generated in a state in which the self-write operation is performed according to the active operation and the information update section signal RH_EN is activated. The second column selection signal RYI may include bits respectively corresponding to the bit lines (BL<J+1:J+K> of FIG. 9) to select at least one of the bit lines (BL<J+1:J+K> of FIG. 9) of the cell block (173 of FIG. 9).

Figure 9:
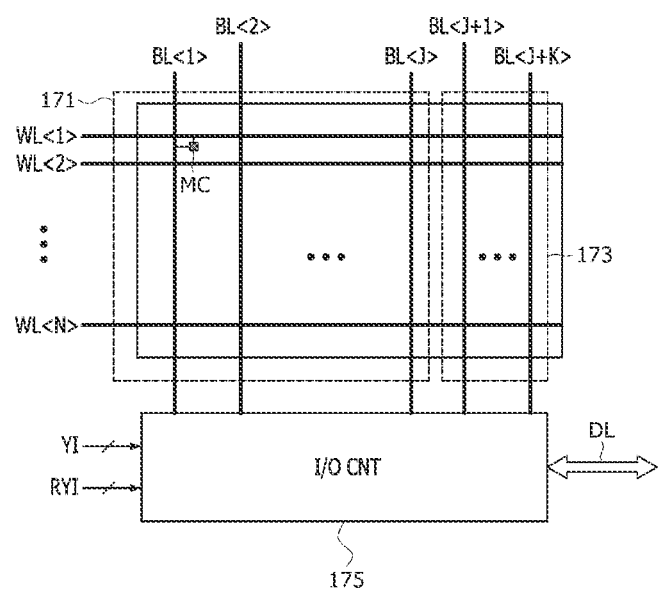
FIG. 9 is a diagram illustrating a configuration of a core circuit according to an embodiment of the present disclosure.

The core circuit 123 may include the cell blocks (171 and 173 of FIG. 9) including memory cells (not shown) selected based on the word lines WLs and the bit lines (BL<1:J+K> of FIG. 9). At least one of the word lines WLs of the cell blocks (171 and 173 of FIG. 9) may be selected by the row decoder 119 and at least one of the bit lines (BL<1:J+K> of FIG. 9) of the cell blocks (171 and 173 of FIG. 9) may be selected by one of the first column selection signal YI and the second column selection signal RYI generated in the column decoder 121. When a read operation is performed, the core circuit 123 may output data (not shown) stored in a memory cell connected to at least one of the word lines WLs selected by the row decoder 119 and to at least one of the bit lines (BL<1:J> in FIG. 9) selected by the column decoder 121 through a data line DL. When a write operation is performed, the core circuit 123 may store data (not shown) input through the data line DL in a memory cell connected at least one of the word lines WLs selected by the row decoder 119 and at least one of the bit lines (BL<1:J> in FIG. 9) selected by the column decoder 121. When a self-read operation is performed according to the active operation, the core circuit 123 may output selection information data (not shown) stored in the memory cell (not shown) connected to at least one of the word lines WLs selected by the row decoder 119 and at least one of the bit lines (BL<J+1:J+K> in FIG. 9) selected by the column decoder 121 as read data DRH_R through the data line DL. When a self-write operation is performed according to the active operation, the core circuit 123 may store write data DRH_W input through the data line DL to the memory cell connected to at least one of the word lines WLs selected by the row decoder 119 and at least one of the bit lines (BL<J+1:J+K> in FIG. 9) selected by the column decoder 121 as the selection information data (not shown). The selection information data (not shown) may include information on the number of times the word lines WLs are selected, and may be initialized to a set value set to "0". The selection information data may include bits respectively corresponding to the word lines WLs, and the bits included in the selection information data may have logic bit sets corresponding to the set value for the number of times the corresponding word line is selected.

When a read operation is performed, the input/output circuit 125 may receive the data (not shown) stored in the cell block (171 of FIG. 9) of the core circuit 123 through the data line DL, and output the received data as transmission data TD. When a write operation is performed, the input/output circuit 125 may receive the transmission data TD and store the transmission data TD in the cell block (171 of FIG. 9) through the data line DL.

The data control circuit 127 may receive the refresh pulse REFP from the control signal decoder 111, receive the information update section signal RH_EN from the information update control circuit 115, and receive the read column strobe pulse CASP_R and the write column strobe pulse CASP_W from the column control circuit 117. The data control circuit 127 may generate the write data DRH_W from the read data DRH_R or initialize the write data DRH_W based on the information update section signal RH_EN, the read column strobe pulse CASP_R, the write column strobe pulse CASP_W, and the refresh pulse REFP. The data control circuit 127 may increase a set value of the read data DRH_R received from the core circuit 123 through the data line DL by '1' when the read column strobe pulse CASP_R is generated in a state in which a self-read operation is performed according to the active operation and the information update section signal RH_EN is activated. The data control circuit 127 may generate write data DRH_W having the increased set value of the read data DRH_R when the write column strobe pulse CASP_W is generated in a state in which a self-write operation is performed according to the active operation and the information update section signal RH_EN is activated. As an example, when the self-read operation and the self-write operation are sequentially performed according to the active operation in a state in which the set value of the read data DRH_R is set to "3", the data control circuit 127 may generate write data DRH_W having a set value '4' increased by '1' from the set value '3' of the read data DRH_R. The write data DRH_W may be stored in the cell block (173 of FIG. 9) included in the core circuit 123 through the data line DL. The data control circuit 127 may initialize the set value of the write data DRH_W to "0" when the write column strobe pulse CASP_W is generated in a state in which a refresh operation is performed and the information update section signal RH_EN is deactivated.

The detection control circuit 131 may receive the row address RADD from the row control circuit 113, and receive the read data DRH_R from the core circuit 123. The detection control circuit 131 may generate a detection flag RH_D and a target address TADD based on the read data DRH_R, a reference data SV, and the row address RADD. The reference data SV may be set to a logic bit set corresponding to a reference value. As an example, the reference data SV may be set to a binary logic bit set "01111" corresponding to the reference value "15". The read data DRH_R may be generated in the self-read operation performed according to the active operation. The detection control circuit 131 may compare the read data DRH_R and the reference data SV to generate the detection flag RH_D. The detection control circuit 131 may generate a detection flag RH_D that is activated when the set value of the read data DRH_R exceeds the reference value of the reference data SV, and may generate a detection flag RH_D that is deactivated when the set value of the read data DRH_R is less than or equal to the reference value of the reference data SV. For example, when the set value of the read data DRH_R is the binary logic bit set '10000' in a state in which the reference value of the reference data SV is set to the binary logic bit set '01111', the detection control circuit 131 may generate a detection flag RH_D that is activated to a logic "high" level. When the detection flag RH_D is activated, the detection control circuit 131 may latch the row address RADD, and output the latched row address RADD as the target address TADD.

The refresh control circuit 133 may receive the refresh pulse REFP from the control signal decoder 111, and receive the detection flag RH_D from the detection control circuit 131. The refresh control circuit 133 may generate an internal refresh pulse IREFP and a smart refresh pulse SREFP based on the detection flag RH_D and the refresh pulse REFP. The refresh control circuit 133 may generate the internal refresh pulse IREFP for controlling a refresh operation in a state in which the detection flag RH_D is deactivated. The refresh control circuit 133 may generate the smart refresh pulse SREFP for controlling a smart refresh operation in a state in which the detection flag RH_D is activated. The refresh operation may be performed on a memory cell array connected to a word line selected by the row address RADD generated by the row control circuit 113. The smart refresh operation may be performed on a memory cell array connected to a target word line selected by the target address TADD generated by the detection control circuit 131 and memory cell arrays respectively connected to the adjacent word lines adjacent to the target word line. The number of adjacent word lines adjacent to the target word line may be variously set according to embodiments.

Figure 2:
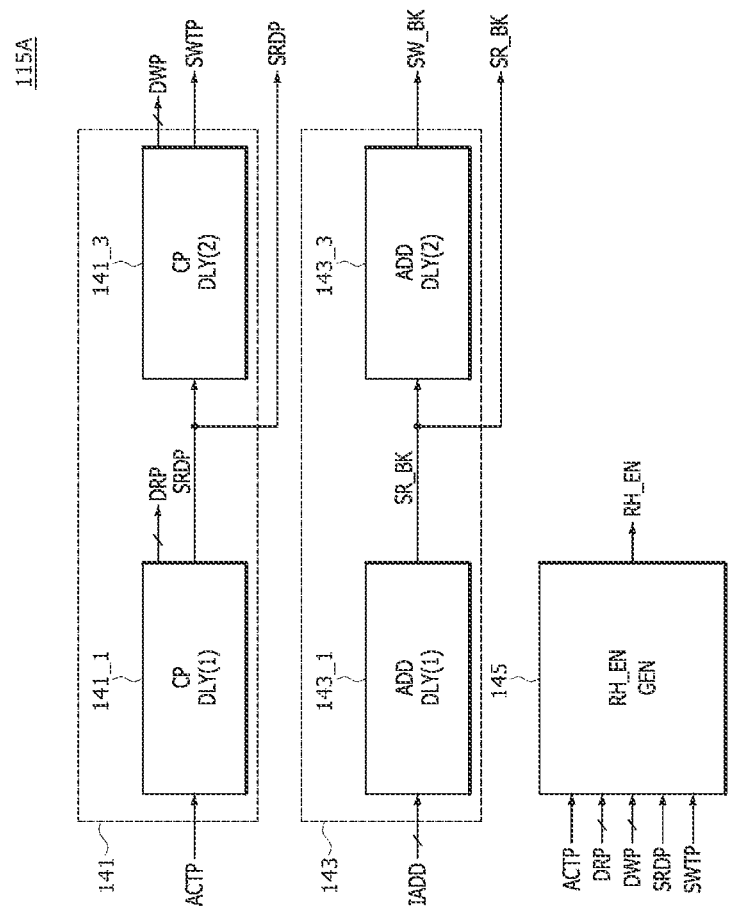
FIG. 2 is a block diagram illustrating a configuration of an information update control circuit according to an embodiment of the present disclosure.

FIG. 2 is a block diagram illustrating a configuration of an information update control circuit 115A according to an embodiment of the present disclosure. As shown in FIG. 2, the information update control circuit 115A may include a command pulse delay circuit 141, an address delay circuit 143, and an information update section signal generation circuit 145.

The command pulse delay circuit 141 may include a first command pulse delay circuit 141_1 and a second command pulse delay circuit 141_3. The first command pulse delay circuit 141_1 may delay an active pulse ACTP to generate a delay read pulse DRP and a self-read pulse SRDP. The first command pulse delay circuit 141_1 may delay the active pulse ACTP by a first command pulse delay time to generate a self-read pulse SRDP. The second command pulse delay circuit 141_3 may delay the self-read pulse SRDP by a second command pulse delay time to generate a delay write pulse DWP and a self-write pulse SWTP.

The address delay circuit 143 may include a first address delay circuit 143_1 and a second address delay circuit 143_3. The first address delay circuit 143_1 may delay an internal address IADD by a first address delay time to generate a self-read bank address SR_BK. The second address delay circuit 143_3 may delay the self-read bank address SR_BK by a second address delay time section to generate a self-write bank address SWBK.

The information update section signal generation circuit 145 may receive the delay read pulse DRP and the self-read pulse SRDP from the first command pulse delay circuit 141_1, and may receive the delay write pulse DWP and the self-write pulse SWTP from the second command pulse delay circuit 141_3. The information update section signal generation circuit 145 may generate an information update section signal RH_EN that is activated during an information update section based on the active pulse ACTP, the delay read pulse DRP, the self-read pulse SRDP, the delay write pulse DWP, and the self-write pulse SWTP. The information update section in which the information update section signal RHEN is activated may be set to a time in which the first command pulse delay time and the second command pulse delay times are summed.

Figure 3:
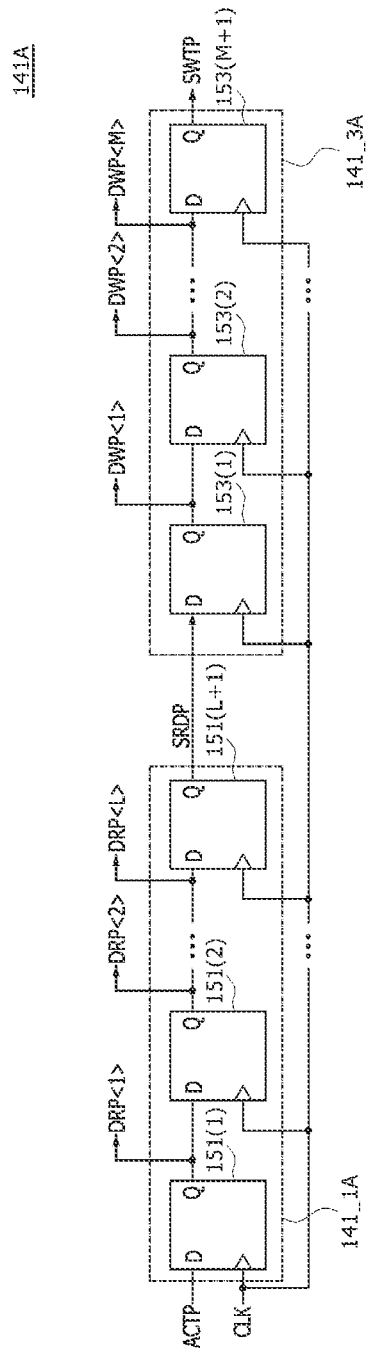
FIG. 3 is a circuit diagram illustrating a configuration of a command pulse delay circuit according to an embodiment of the present disclosure.

FIG. 3 is a circuit diagram illustrating a configuration of a command pulse delay circuit 141A according to an embodiment of the present disclosure. As shown in FIG. 3, the command pulse delay circuit 141A may include a first command pulse delay circuit 141_1A and a second command pulse delay circuit 141_3A.

The first command pulse delay circuit 141_1A may include first to (L+1)th read command pulse latches 151(1:L+1). The first read command pulse latch 151(1) may latch an active pulse ACTP in synchronization with a clock CLK, and output the latched active pulse ACTP as a first bit DRP<1> of the delay read pulse DRP. The second read command pulse latch 151(2) may latch the first bit DRP<1> of the delay read pulse DRP in synchronization with the clock CLK, and output the latched first bit DRP<1> of the delay read pulse DRP as a second bit DRP<2> of the delay read pulse DRP. The $(L+1)^{th}$ read command pulse latch 151(L+1) may latch an $L^{th}$ bit DRP<L> of the delay read pulse DRP in synchronization with the clock CLK, and output the latched L bit DRP<L> of the delay read pulse DRP as a self read pulse SRDP. A section in which the active pulses ACTPs are sequentially latched through the first to $(L+1)^h$ read command pulse latches 151(1:L+1) may be set as a first command pulse delay section. The clock CLK may be applied from an external device of the semiconductor device 10 or may be implemented to be generated inside the semiconductor device 10. Here, 'L' may be set to a natural number of 3 or more.

The second command pulse delay circuit 141_3A may include first to $(M+1)^{th}$ write command pulse latches 153(1:M+1). The first write command pulse latch 153(1) may latch the self-read pulse SRDP in synchronization with the clock CLK, and output the latched self-read pulse SRDP as a first bit DWP<1> of the delay write pulse DWP. The second write command pulse latch 153(2) may latch the first bit DWP<1> of the delay write pulse DWP in synchronization with the clock CLK, and output the latched first bit DWP<1> of the delay write pulse DWP as a second bit DWP<2> of the delay write pulse DWP. The $(M+1)^{th}$ write command pulse latch 153(M+1) may latch the $M^{th}$ bit DWP<M> of the delay write pulse DWP in synchronization with a clock CLK, and may output the latched $M^{th}$ bit DWP<M> of the delay write pulse DWP as a self-write pulse SWTP. A section in which the self-read pulses SRDPs are sequentially latched through the first to $(M+1)^{th}$ write command pulse latches 153(1:M+1) may be set as a second command pulse delay section. Here, 'M' may be set to a natural number of 3 or more.

Figure 4:
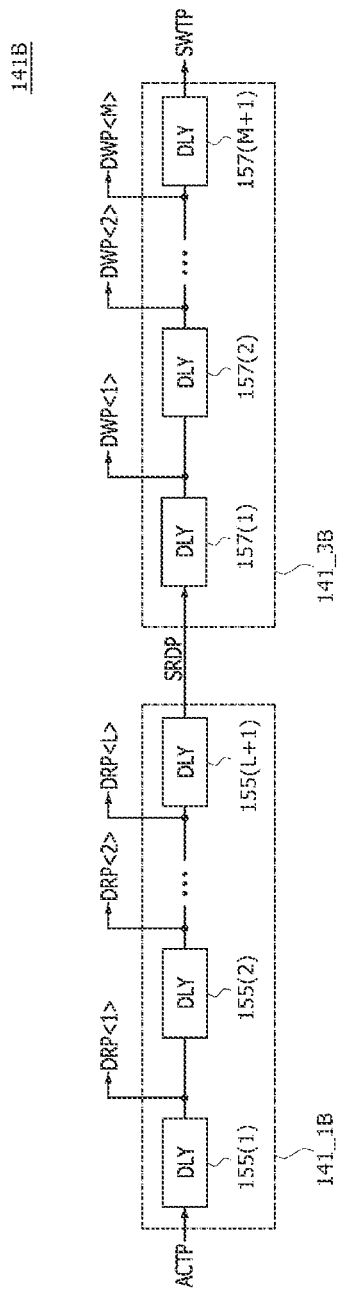
FIG. 4 is a circuit diagram illustrating a configuration of a command pulse delay circuit according to another embodiment of the present disclosure.

FIG. 4 is a circuit diagram illustrating a configuration of a command pulse delay circuit 141B according to another embodiment of the present disclosure. As shown in FIG. 4, the command pulse delay circuit 141B may include a first command pulse delay circuit 141_1B and a second command pulse delay circuit 141_3B.

The first command pulse delay circuit 141_1B may include first to $(L+1)^{th}$ read command pulse delay units 155(1:L+1). The first read command pulse delay unit 155(1) may latch an active pulse ACTP in synchronization with a clock CLK, and output the latched active pulse ACTP as a first bit DRP<1> of a delay read pulse DRP. The second read command pulse delay unit 155(2) may latch the first bit DRP<1> of the delay read pulse DRP in synchronization with the clock CLK, and output the latched first bit DRP<1> of the delay read pulse DRP as a second bit DRP<2> of the delay read pulse DRP. The $(L+1)^{th}$ read command pulse delay unit 155(L+1) may latch an $L^h$ bit DRP<L> of the delay read pulse DRP in synchronization with the clock CLK, and output the latched $L^{th}$ bit DRP<L> of the delay read pulse DRP as a self-read pulse SRDP. A section in which the active pulses ACTPs are sequentially latched through the first to $(L+1)^{th}$ read command pulse delay units 155(1:L+1) may be set as a first command pulse delay section.

The second command pulse delay circuit 141_3B may include first to $(M+1)^{th}$ write command pulse delay units 157(1:M+1). The first write command pulse delay unit 157(1) may latch the self-read pulse SRDP in synchronization with the clock CLK, and output the latched self-read pulse SRDP as a first bit DWP<1> of a delay write pulse DWP. The second write command pulse delay unit 157(2) may latch the first bit DWP<1> of the delay write pulse DWP in synchronization with the clock CLK, and output the latched first bit DWP<1> of the delay write pulse DWP as a second bit DWP<2> of the delay write pulse DWP. The $(M+1)^{th}$ write command pulse delay unit 157(M+1) may latch an $M^{th}$ bit DWP<M> of the delay write pulse DWP in synchronization with the clock CLK, and output the latched $M^{th}$ bit DWP<M> of the delay write pulse DWP as a self-write pulse SWTP. A section in which the self-read pulses SRDPs are sequentially latched through the first to $(M+1)^{th}$ write command pulse delay units 157(1:M+1) may be set as a second command pulse delay section.

Figure 5:
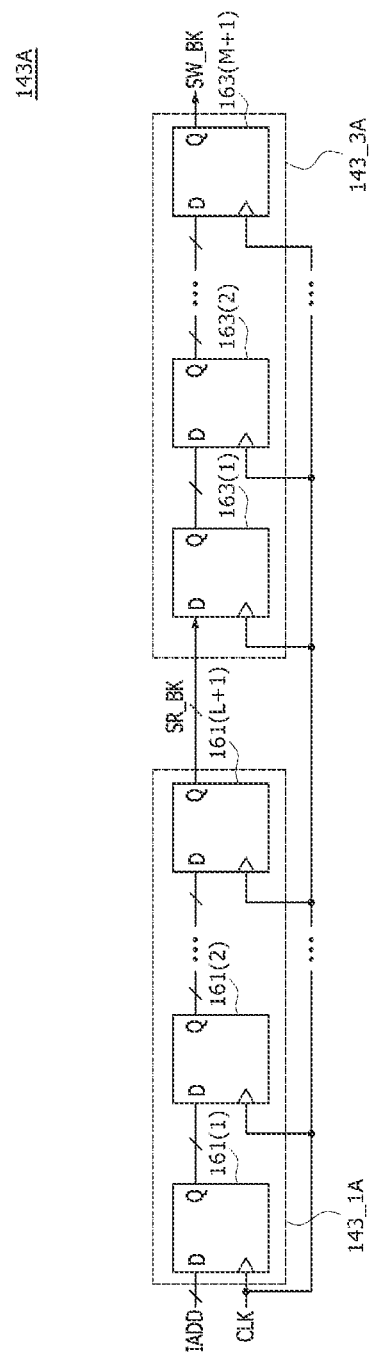
FIG. 5 is a block diagram illustrating a configuration of an address delay circuit according to an embodiment of the present disclosure.

FIG. 5 is a block diagram illustrating a configuration of an address delay circuit 143A according to an embodiment of the present disclosure. As shown in FIG. 5, the address delay circuit 143A may include a first address delay circuit 143_1A and a second address delay circuit 143_3A.

The first address delay circuit 143_1A may include first to $(L+1)^{th}$ read address latches 161(1:L+1). The first address delay circuit 143_1A may delay an internal address IADD by a first address delay section in synchronization with a clock CLK through the first to $(L+1)^{th}$ read address latches 161(1:L+1) to generate a self-read bank address SR_BK.

The second address delay circuit 143_3A may include first to $(M+1)^{th}$ write address latches 163(1:M+1). The second address delay circuit 143_3A may delay the self-read bank address SR_BK by a second address delay section in synchronization with the clock CLK through the first to $(M+1)^{th}$ writer address latches 163(1:M+1) to generate a self-write bank address SW_BK.

Figure 6:
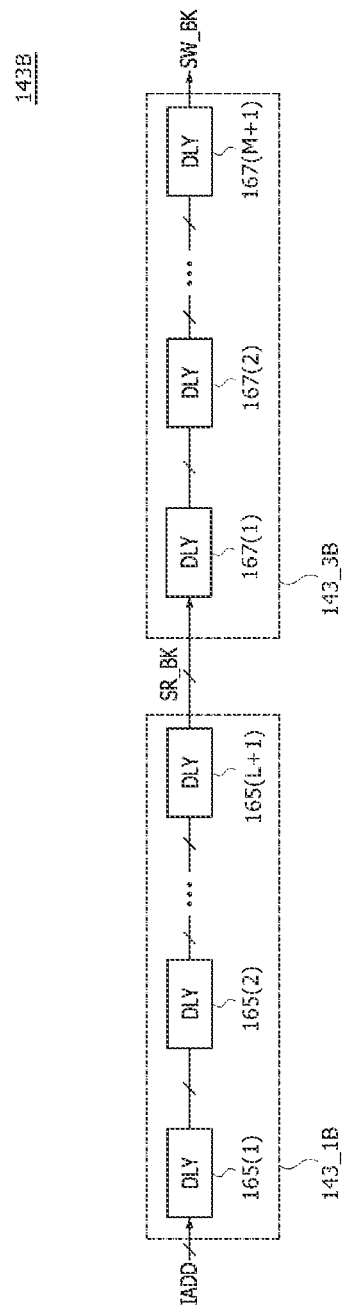
FIG. 6 is a block diagram illustrating a configuration of an address delay circuit according to another embodiment of the present disclosure.

FIG. 6 is a block diagram illustrating a configuration of an address delay circuit 143B according to another embodiment of the present disclosure. As shown in FIG. 6, the address delay circuit 143B may include a first address delay circuit 143_1B and a second address delay circuit 143_3B.

The first address delay circuit 143_16 may include first to $(L+1)^{th}$ read address delay units 165(1:L+1). The first address delay unit 143_16 may delay an internal address IADD by a first address delay time through the read address delay units 165(1:L+1) to generate a self-read bank address SR_BK.

The second address delay circuit 143_3B may include first to $(M+1)^{th}$ write address delay units 167(1:M+1). The second address delay unit 143_3B may delay the self-read bank address SR_BK by a second address delay time through the first to $(M+1)^{th}$ write address delay units 167(1:M+1) to generate a self-write bank address SW_BK.

Figure 7:
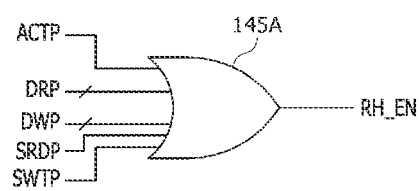
FIG. 7 is a circuit diagram illustrating a configuration of an information update section signal generation circuit according to an embodiment of the present disclosure.

FIG. 7 is a circuit diagram illustrating a configuration of an information update section signal generation circuit 145A according to an embodiment of the present disclosure. As shown in FIG. 7, the information update section signal generation circuit 145A may receive an active pulse ACTP, a delay read pulse DRP, a self-read pulse SRDP, a delay write pulse DWP, a self-write pulse SWTP, a self-read bank address SR_BK, and a self-write bank address SW_BK to perform an OR operation and generate an information update section signal RH_EN. The information update section signal generation circuit 145A may generate an information update section signal RH_EN that is activated during an information update section set as the sum of a first command pulse delay section and a second command pulse delay section.

Figure 8:
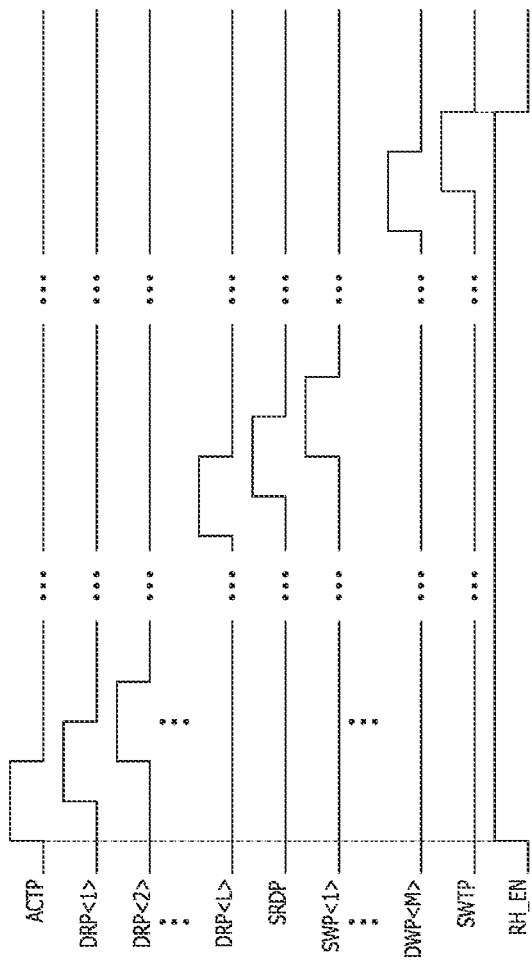
FIG. 8 is a timing diagram illustrating an operation of an information update section signal generation circuit according to an embodiment of the present disclosure.

FIG. 8 is a timing diagram illustrating an operation of an information update section signal generation circuit 145A according to an embodiment of the present disclosure. As shown in FIG. 8, because an active operation is performed to generate an active pulse ACTP, and first to $L^{th}$ bits DRP<1:L> of a delay read pulse DRP, a self-read pulse SRDP, first to $M^{th}$ bits DWP<1:M> of the delay write pulse DWP, and a self-write pulse SWTP are sequentially generated, an information update section signal RH_EN may be activated to a logic "high" level during a section from a time when the active pulse ACTP is generated at a logic "high" level to a time when the self-write pulse SWTP is generated at a logic "high" level.

FIG. 9 is a diagram illustrating a configuration of a core circuit 123A according to an embodiment of the present disclosure. As shown in FIG. 9, the core circuit 123A may include a first cell block 171, a second cell block 173, and an input/output control circuit (I/O CNT) 175.

The first cell block 171 may include memory cells (not shown) respectively connected to word lines WL<1:N> and bit lines BL<1:J>. Among the memory cells included in the first cell block 171, only a memory cell MC connected to the word line WL<1> and the bit line BL<1> is illustrated as representative. When a read operation is performed, data stored in the memory cell connected to at least one selected from the word lines WL<1:N> and at least one selected from the bit lines BL<1:J> may be output from the first cell block 171. When a write operation is performed, the data received to the first cell block 171 through the data line DL may be stored in a memory cell connected to at least one selected from the word lines WL<1:N> and at least one selected from the bit lines BL<1:J>. Here, 'N' may be set to a natural number of 2 or more.

The second cell block 173 may include memory cells (not shown) respectively connected to the word lines WL<1:N> and the bit lines BL<J+1:J+K>. When a self-read operation is performed according to an active operation, selection information data (not shown) stored in a memory cell connected to at least one selected from the word lines WL<1:N> and at least one selected from the bit lines BL<J+1:J+K> may be output from the second cell block 173 as read data (DRH_R of FIG. 1) through the data line DL. When a self-write operation is performed according to the active operation, write data (DRH_W in FIG. 1) received to the second cell block 173 through the data line DL may be stored in a memory cell connected to at least one selected from the word lines WL<1:N> and at least one selected from the bit lines BL<J+1:J+K> as selection information data (not shown). Here, 'J' and 'K' may be set to natural numbers of 2 or more.

When the read operation is performed, the input/output control circuit 175 may control the first cell block 171 so that data stored in a memory cell connected to at least one selected from the word lines WL<1:N> and at least one selected from the bit lines BL<1:J> is output through the data line DL. When the write operation is performed, the input/output control circuit 175 may control the first cell block 171 so that data received through the data line DL is stored in a memory cell connected to at least one selected from the word lines WL<1:N> and at least one selected from the bit lines BL<1:J>. When the self-read operation is performed according to the active operation, the input/output control circuit 175 may control the second cell block 173 so that the selection information data stored in a memory cell connected to at least one selected from the word lines WL<1:N> and at least one selected from the bit lines BL<J+1:J+K> is output through the data line DL. When the self-write operation is performed according to the active operation, the input/output control circuit 175 may control the second cell block 173 so that the selection information data received through the data line DL to a memory cell connected to at least one selected from the word lines WL<1:N> and to at least one selected from the bit lines BL<J+1:J+K> is stored.

Although the core circuit 123A shown in FIG. 9 is centered on the configuration of one bank (not shown) for convenience of description, it may be implemented as a plurality of banks according to an embodiment, and each bank may be configured to include cell blocks and an input/output control circuit.

Figure 10:
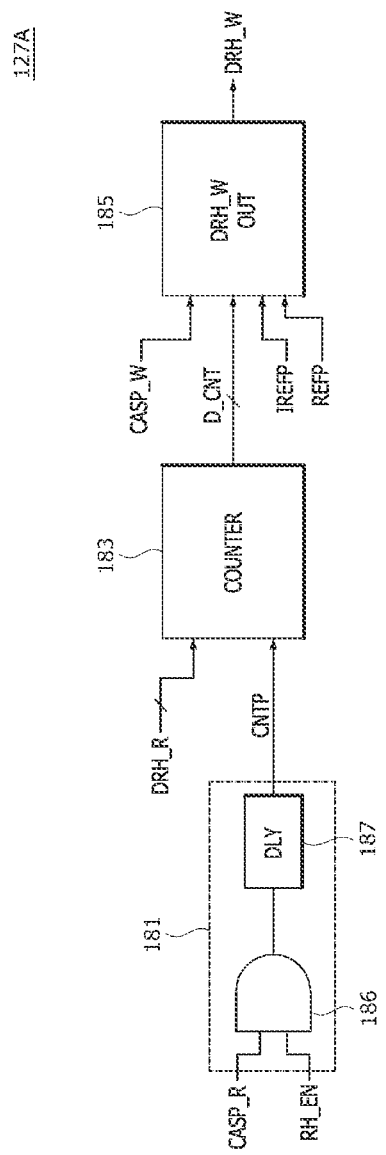
FIG. 10 is a block diagram illustrating a configuration of a data control circuit according to an embodiment of the present disclosure.

FIG. 10 is a block diagram illustrating a configuration of a data control circuit 127A according to an embodiment of the present disclosure. As shown in FIG. 10, the data control circuit 127A may include a counting pulse generation circuit 181, a counter 183, and a write data output circuit (DRH_W OUT) 185.

The counting pulse generation circuit 181 may include a logic device 186 and a delay unit (DLY) 187. The logic device 186 may receive a read column strobe pulse CASP_R and an information update section signal RH_EN to perform an AND operation. The delay unit 187 may delay an output signal of the logic device 186 by a delay time to output a counting pulse CNTP. The counting pulse generation circuit 181 may generate the counting pulse CNTP activated to a logic "high" level when a read column strobe pulse CASP_R is generated at a logic "high" level in a state in which a self-read operation is performed according to an active operation and an information update section signal RHEN is activated to a logic "high" level.

The counter 183 may receive the counting pulse CNTP from the counting pulse generation circuit 181. The counter 183 may perform a counting operation when the counting pulse CNTP is activated to increase a set value of read data DRH_R by '1' and output the set value as counting data D_CNT.

The write data output circuit 185 may receive the counting data D_CNT from the counter 183. The write data output circuit 185 may generate write data DRH_W based on a write column strobe pulse CASPW, the counting data D_CNT, and a refresh pulse REFP. The write data output circuit 185 may output the counting data D_CNT as the write data DRH_W when the read column strobe pulse CASP_R is generated at a logic "high" level in a state in which a self-read operation is performed according to an active operation and the information update section signal RHEN is activated to a logic "high"20 level. The write to DRH_W may be set to have a set value after increasing by '1' the set value of the read data DRH_R output in the self-read operation. The write data output circuit 185 may initialize the set value of the write data DRHW to '0' when a write column strobe pulse CASP_W is generated at a logic "high" level in a state in 31 which a refresh operation is performed and the information update section signal RH_EN is deactivated to a logic "low" level.

Figure 11:
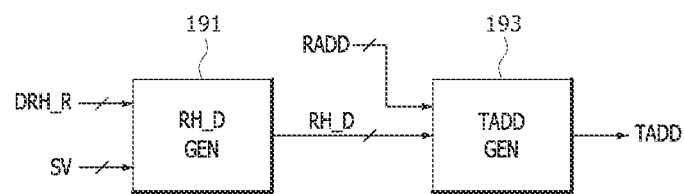
FIG. 11 is a block diagram illustrating a configuration of a detection control circuit according to an embodiment of the present disclosure.

FIG. 11 is a block diagram illustrating a configuration of a detection control circuit 131A according to an embodiment of the present disclosure. As shown in FIG. 11, the detection control circuit 131A may include a detection flag generation circuit (RH_D GEN) 191 and a target address generation circuit (TADD GEN) 193.

The detection flag generation circuit 191 may generate a detection flag RH_D based on read data DRH_R and reference data SV. The detection flag generation circuit 191 may generate a detection flag RH_D that is activated when the set value of the read data DRH_R exceeds the reference value of the reference data SV, and generate a detection flag RH_D that is deactivated when the set value of the read data DRH_R is less than the reference value of the reference data SV.

The target address generation circuit 193 may receive the detection flag RH_D from the detection flag generation circuit 191. The target address generation circuit 193 may output the row address RADD as a target address TADD when the detection flag RH_D is activated.

Figure 12:
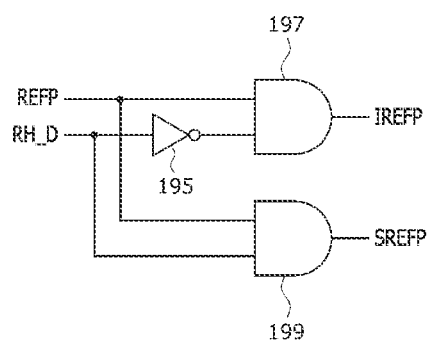
FIG. 12 is a circuit diagram illustrating a configuration of a refresh control circuit according to an embodiment of the present disclosure.

FIG. 12 is a circuit diagram illustrating a configuration of a refresh control circuit 133A according to an embodiment of the present disclosure. As shown in FIG. 12, the refresh control circuit 133A may include an inverter 195 and logic devices 197 and 199. The inverter 195 may inversely buffer a detection flag RH_D to output an inversely-buffered detection flag RH_D. The logic device 197 may receive a refresh pulse REFP and an output signal of the inverter 195 and perform an AND operation to generate an internal refresh pulse IREFP.

The logic device 199 may receive the refresh pulse REFP and the detection flag RH_D and perform an AND operation to generate a smart refresh pulse SREFP. The refresh control circuit 133A may generate the internal refresh pulse IREFP for controlling a refresh operation performed on the memory cell array connected to a word line selected by a row address RADD when the detection flag RH_D is deactivated. The refresh control circuit 133A may generate a smart refresh pulse SREFP for controlling a smart refresh operation performed on memory cell arrays respectively connected to the adjacent word lines adjacent to a target word line when the detection flag RH_D is activated.

The operation of the semiconductor device 10 configured as described above will be described with reference to FIGS. 13 to 16.

Figure 13:
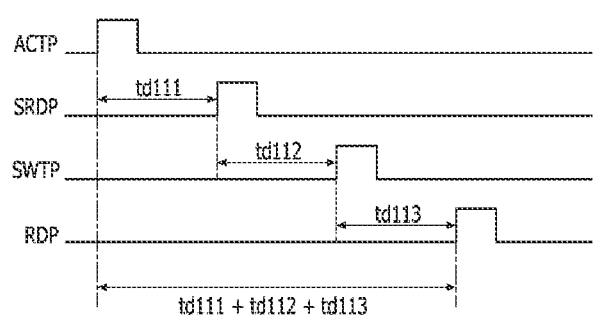
FIGS. 13 to 16 are timing diagrams illustrating an operation of a semiconductor device according to an embodiment of the present disclosure.

As shown in FIG. 13, when an active operation and a read operation are sequentially performed, a self-read pulse SRDP for a self-read operation may be generated when a first time interval td111 elapses from a time when an active pulse ACTP for the active operation is generated, a self-write pulse SWTP for a self-write operation may be generated when a second time interval td112 elapses from a time when the self-read pulse SRDP is generated, and a read pulse RDP for the read operation may be generated when a third time interval td113 elapses from a time when the self-write pulse SWTP is generated. Here, each of the first time interval td111 and the third time interval td113 may be set to a row address to column address delay tRCD, and the second time interval td112 may be set to a section necessary to generate write data DRH_W by increasing a set value of read data DRH_R output from a core circuit (123 of FIG. 1) through the self-read operation and to store the write data DRH_W in the core circuit 123.

Figure 14:
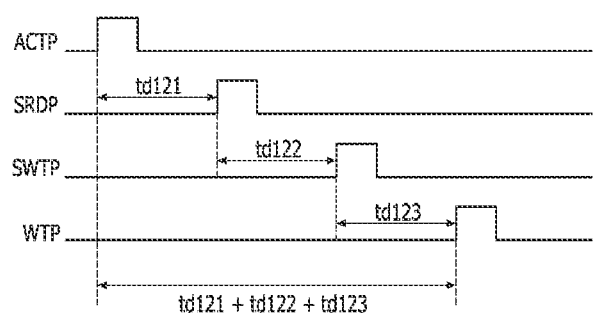

As shown in FIG. 14, when an active operation and a write operation are sequentially performed, a self-read pulse SRDP for a self-read operation may be generated when a first time interval td121 elapses from a time when the active pulse ACTP for the active operation is generated, a self-write pulse SWTP for a self-write operation may be generated when a second time interval td122 elapses from a time when the self-read pulse SRDP is generated, and a write pulse WTP for a write operation may be generated when a third time interval td123 elapses from a time when the self-write pulse SWTP is generated. Here, each of the first time interval td121 and the third time interval td123 may be set to a row address to column address delay tRCD, and the second time interval td122 may be set to a time necessary to generate the write data DRH_W by increasing the set value of the read data DRH_R output from the core circuit (123 of FIG. 1) through the self-read operation, and to store the write data DRH_W in the core circuit 123.

Figure 15:
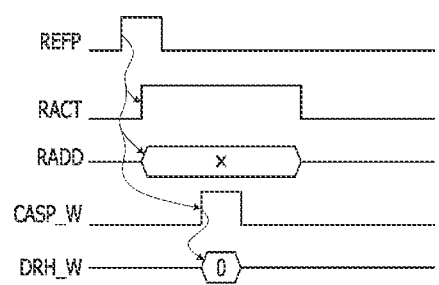

As shown in FIG. 15, when a refresh pulse REFP is generated, a row active signal RACT may be activated, a row address RADD corresponding to an "X"$^{th}$ word line may be generated, and a write column strobe pulse CASP_W may be generated. When the number of times the "X"$^{th}$ word line is selected is less than or equal to a reference value, a refresh operation may be performed on the memory cells connected to the "X"$^{th}$ word line of a first cell block (171 of FIG. 9). When such a refresh operation is performed, write data DRH_W initialized to a set value of '0' by a write column strobe pulse CASP_W may be stored in the memory cells connected to the "X"$^{th}$ word line of a second cell block (173 of FIG. 9) included in the core circuit (123A in FIG. 9), so that the number of times the "X"$^{th}$ word line on which the refresh operation is performed is selected may be initialized to '0'. Here, 'X' may be set to a natural number equal to or less than 'N' shown in FIG. 9.

Figure 16:
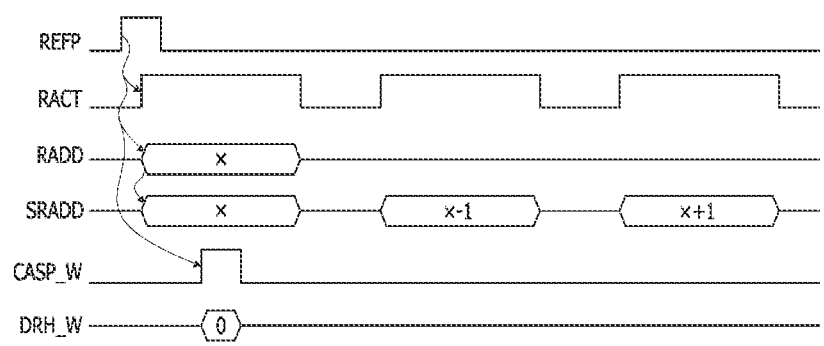

As shown in FIG. 16, when a refresh pulse REFP is generated, a row active signal RACT may be activated, a row address RADD corresponding to the "X"$^{th}$ word line may be generated, and a write column strobe pulse CASP_W may be generated. When the number of times the "X"$^{th}$ word line is selected exceeds a reference value, the row address RADD corresponding to the "X"$^{th}$ word line may be set as the target address TADD, and a smart refresh operation in which the memory cells respectively connected to the "X−1"$^{th}$ word line, the "X"$^{th}$ word line, and the "X+1"$^{th}$ word line of the first cell block (171 of FIG. 9) are sequentially refreshed may be performed. FIG. 16 shows an address SRADD of the individual "X"$^{th}$, "X−1"$^{th}$ and "X+1"$^{th}$ word lines as targets of the smart refresh operation. When such a smart refresh operation is performed, the write data DRH_W initialized to the set value '0' by the write column strobe pulse CASP_W may be stored in the memory cells connected to the "X"$^{th}$ word line of the second cell block (173 of FIG. 9) included in the core circuit (123A of FIG. 9), so that the number of times the "X"$^{th}$ word line is selected on which the smart refresh operation is performed may be initialized to '0'.

Whenever an active operation is performed, the semiconductor device 10 may sequentially perform a self-read operation and a self-write operation to update information on the number of times a word line is selected, and may store the updated information in the second cell block (173 of FIG. 9) as selection information data. Whenever the active operation is performed, the semiconductor device 10 may perform the self-read operation and the self-write operation through a column path circuits (a column control circuit (117 in FIG. 1) and a column decoder (121 in FIG. 1)), which are also used in the read operation and the write operation, thereby minimizing the increase in a circuit area for the self-read/self-write operations. In addition, when updating the information on the number of times the word line is selected, the semiconductor device 10 utilizes a counter (183 in FIG. 10) shared by the word lines rather than counters dedicated to the respective word lines, thereby minimizing the increase in area. In addition, the semiconductor device 10 controls the smart refresh operation to be performed when the number of times the word line is selected according to the active operation exceeds the reference value, thereby preventing deterioration of data stored in the cell blocks connected to the target word line and the adjacent word lines. When the refresh operation is performed, the semiconductor device 10 initializes the information on the number of times the word line is selected, thereby preventing the smart refresh operation from being excessively performed and reducing power consumption.

Figure 17:
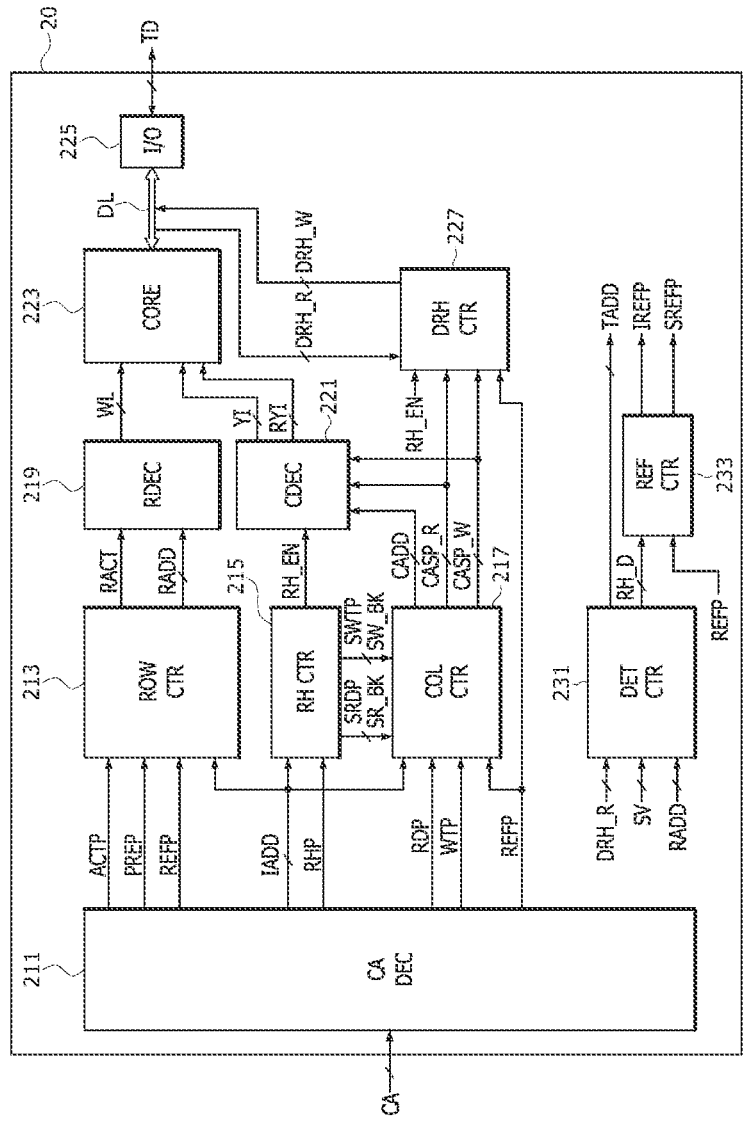
FIG. 17 is a block diagram illustrating a configuration of a semiconductor device according to another embodiment of the present disclosure.

FIG. 17 is a block diagram illustrating a configuration of a semiconductor device 20 according to another embodiment of the present disclosure. As shown in FIG. 17, the semiconductor device 20 may include a control signal decoder (CADEC) 211, a row control circuit (ROW CTR) 213, an information update control circuit (RH CTR) 215, a column control circuit (COL CTR) 217, a row decoder (RDEC) 219, a column decoder (CDEC) 221, a core circuit (CORE) 223, an input/output circuit (I/O) 225, a data control circuit (DRH CTR) 227, a detection control circuit (DET CTR) 231, and a refresh control circuit (REF CTR) 233.

The control signal decoder 211 may receive an external control signal CA from an external device of the semiconductor device 20. The control signal decoder 211 may decode a command included in the external control signal CA to generate an active pulse ACTP, a precharge pulse PREP, a refresh pulse REFP, a self-operation pulse RHP, a read pulse RDP, and a write pulse WTP. The self-operation pulse RHP may be generated to perform a self-operation including a self-read operation and a self-write operation after the active pulse ACTP for an active operation is generated. The self-operation pulse RHP may be generated at a time point when a row address to column address delay tRCD section elapses from a time point when the active pulse ACTP is generated, but this is only an example and the present disclosure is not limited thereto. The control signal decoder 211 may decode an address included in the external control signal CA to generate an internal address IADD. The internal address IADD may include a row address RADD, a column address CADD, or the like.

The row control circuit 213 may receive the active pulse ACTP, the precharge pulse PREP, the refresh pulse REFP, and the internal address IADD. The row control circuit 213 may generate a row active signal RACT and a row address RADD based on the active pulse ACTP, the precharge pulse PREP, the refresh pulse REFP, and the internal address IADD. The row control circuit 213 may generate an activated row active signal RACT when the active pulse ACTP is generated for an active operation, and generate a row address RADD for selecting at least one of the word lines WLs. The row control circuit 213 may deactivate the row active signal RACT when the precharge pulse PREP is generated for a precharge operation in a state in which an active operation is performed and the row active signal RACT is activated. The row control circuit 213 may generate an activated row active signal RACT when a refresh pulse REFP is generated for a refresh operation, and generate a row address RADD for sequentially refreshing all memory cells included in the core circuit 223.

The information update control circuit 215 may receive the self-operation pulse RHP and the internal address IADD from the control signal decoder 211. The information update control circuit 215 may generate a self-read pulse SRDP, a self-read bank address SRBK, a self-write pulse SWTP, a self-write bank address SW_BK, and an information update section signal RHEN, based on the self-operation pulse RHP and the internal address IADD. When the self-operation pulse RHP is generated for a self-operation, the information update control circuit 215 may generate a self-read pulse SRDP and a self-read bank address SR_BK for a self-read operation, and generate a self-write pulse SWTP and a self-write bank address SW_BK for a self-write operation. The information update control circuit 215 may generate the information update signal RH_EN that is activated during an information update time interval set as the section from a time when the self-operation pulse RHP is generated until the self-read pulse SRDP for the self-read operation and the self-write pulse SWTP for the self-write operation are generated. The information update control circuit 215 may generate the self-read pulse SRDP from the self-operation pulse RHP, and delay the self-operation pulse RHP by a command pulse delay section to generate the self-write pulse SWTP. The information update control circuit 215 may generate the self-read bank address SR_BK from the internal address IADD, and delay the internal address IADD by an address delay time to generate the self-write bank address SW_BK. Each of the command pulse delay time and the address delay time may be set as a time necessary to generate write data DRHW by increasing a set value of the read data DRH_R output from the core circuit 223 through the self-read operation and to store the write data DRH_W in the core circuit 223, but this is only an example and the present disclosure is not limited thereto.

The column control circuit 217 may receive the internal address IADD, the read pulse RDP, the write pulse WTP, and the refresh pulse REFP from the control signal decoder 211, and receive the self-read pulse SRDP, the self-read bank address SR_BK, the self-write pulse SWTP, and the self-write bank address SW_BK from the information update control circuit 215. The column control circuit 217 may generate a column address CADD, a read column strobe pulse CASP_R, and a write column strobe pulse CASP_W based on the internal address IADD, the read pulse RDP, the write pulse WTP, and the refresh pulse REFP, the self-read pulse SRDP, the self-read bank address SR_BK, the self-write pulse SWTP, and the self-write bank address SW_BK. The column control circuit 217 may generate the column address CADD based on the internal address IADD when a self-read operation is performed according to an active operation, and generate a read column strobe pulse CASP_R composed of pulses respectively corresponding to the banks (not shown) included in the core circuit 223 based on the self-read pulse SRDP and the self-read bank address SR_BK. The column control circuit 217 may generate the column address CADD based on the internal address IADD when a self-write operation is performed according to the active operation, and generate a write column strobe pulse CASP_W composed of pulses respectively corresponding to the banks (not shown) included in the core circuit 223 based on the self-write pulse SWTP and the self-write bank address SW_BK. The column control circuit 217 may generate a write column strobe pulse CASP_W composed of pulses respectively corresponding to the banks (not shown) included in the core circuit 223 based on the refresh pulse REFP when the refresh operation is performed. The column control circuit 217 may generate a column address CADD based on the internal address IADD when a read operation is performed, and generate a read column strobe pulse CASP_R composed of pulses respectively corresponding to the banks (not shown) included in the core circuit 223 based on the read pulse RDP and the internal address IADD. The column control circuit 217 may generate a column address CADD based on the internal address IADD when a write operation is performed, and generate a write column strobe pulse CASP_W composed of pulses respectively corresponding to the banks (not shown) included in the core circuit 223 based on the write pulse WTP and the internal address IADD.

The row decoder 219 may receive the row active signal RACT and the row address RADD from the row control circuit 213. The row decoder 219 may select at least one of the banks (not shown) included in the core circuit 223 based on the row active signal RACT and the row address RADD, and select at least one of the word lines WLs included in the selected bank when an active operation or a refresh operation is performed.

The column decoder 221 may receive the information update section signal RH_EN from the information update control circuit 215, and receive the column address CADD, the read column strobe pulse CASP_R, and a write column strobe pulse CASP_W from the column control circuit 217. The column decoder 221 may generate a first column selection signal YI based on the column address CADD when the read column strobe pulse CASP_R is generated in a state in which a read operation is performed and the information update section signal RH_EN is deactivated. The column decoder 221 may generate the first column selection signal YI based on the column address CADD when the write column strobe pulse CASP_W is generated in a state in which the write operation is performed and the information update section signal RH_EN is deactivated. The column decoder 221 may generate a second column selection signal RYI based on the column address CADD when the read column strobe pulse CASP_R is generated in a state in which a self-read operation is performed according to an active operation and the information update section signal RH_EN is activated. The column decoder 221 may generate the second column selection signal RYI based on the column address CADD when the write column strobe pulse CASP_W is generated in a state in which a self-write operation is performed according to the active operation and the information update section signal RH_EN is activated.

The core circuit 223 may include cell blocks (not shown) accessed by the word lines WLs, the first column selection signal YI, and the second column signal RYI. The core circuit 223 may output data stored in a memory cell of the cell block (not shown) selected by the word lines WLs and the first column selection signal YI through a data line DL when a read operation is performed. The core circuit 223 may store the data (not shown) input through the data line DL in a memory cell of the cell block (not shown) selected by the word lines WLs and the first column selection signal YI when a write operation is performed. The core circuit 223 may output selection information data (not shown) to a memory cell of the cell block (not shown) selected by the word lines WL and the second column selection signal RYI as read data DRH_R through the data line DL when a self-read operation is performed. The core circuit 223 may store write data DRH_W input through the data line DL in a memory cells of the cell block (not shown) selected by the word lines WLs and the second column selection signal RYI as the selection information data (not shown) when a self-write operation is performed.

The input/output circuit 225 may control a data input/output operation through transmission data TD of the core circuit 223 when a read operation and a write operation are performed.

The data control circuit 227 may receive the refresh pulse REFP from the control signal decoder 211, receive the information update section signal RH_EN from the information update control circuit 215, and receive the read column strobe pulse CASP_R and the write column strobe pulse CASP_W from the column control circuit 217. The data control circuit 227 may generate write data DRH_W from the read data DRH_R and initialize the write data DRH_W based on the information update section signal RH_EN, the read column strobe pulse CASP_R, the write column strobe pulse CASP_W, and the refresh pulse REFP. The data control circuit 227 may increase a set value of the read data DRH_R received from the core circuit 223 through the data line DL by '1' when a read column strobe pulse CASP_R is generated in a state in which a self-read operation is performed and the information update section signal RH_EN is activated. The data control circuit 227 may generate write data DRH_W having the increased set value of the read data DRH_R when a write column strobe pulse CASP_W is generated in a state in which a self-write operation is performed and the information update section signal RH_EN is activated. The data control circuit 227 may initialize the set value of the write data DRH_W to '0' when the write column strobe pulse CASP_W is generated in a state in which the refresh operation is performed and the information update section signal RH_EN is deactivated.

The detection control circuit 231 may receive the row address RADD from the row control circuit 213, and receive the read data DRH_R from the core circuit 223. The detection control circuit 231 may generate a detection flag RH_D and a target address TADD based on the read data DRH_R, reference data SV, and the row address RADD. The detection control circuit 231 may compare the read data DRH_D and the reference data SV to generate the detection flag RH_D. The detection control circuit 231 may generate a detection flag RH_D that is activated when the set value of the read data DRH_R exceeds the reference value of the reference data SV, and generate a detection flag RH_D that is deactivated when the set value of the read data DRH_R is less than or equal to the reference value of the reference data SV. The detection control circuit 231 may latch the row address RADD when the detection flag RH_D is activated, and output the latched row address RADD as the target address TADD.

The refresh control circuit 233 may receive the refresh pulse REFP from the control signal decoder 211 and receive the detection flag RH_D from the detection control circuit 231. The refresh control circuit 233 may generate an internal refresh pulse IREFP and a smart refresh pulse SREFP based on the detection flag RH_D and the refresh pulse REFP. The refresh control circuit 233 may generate an internal refresh pulse IREFP for controlling a refresh operation in a state in which the detection flag RH_D is deactivated. The refresh control circuit 233 may generate a smart refresh pulse SREFP for controlling a smart refresh operation in a state in which the detection flag RH_D is activated.

Figure 18:
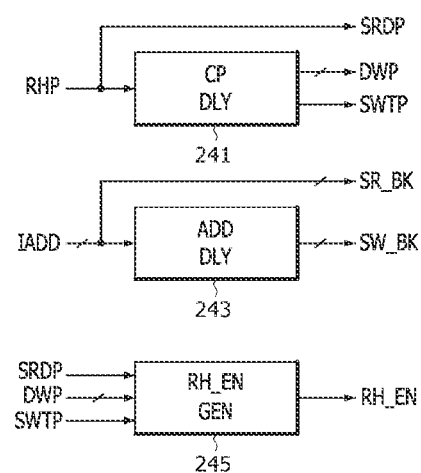
FIG. 18 is a block diagram illustrating a configuration of an information update control circuit according to another embodiment of the present disclosure.

FIG. 18 is a block diagram illustrating a configuration of an information update control circuit 215A according to another embodiment of the present disclosure. As shown in FIG. 18, the information update control circuit 215A may include a command pulse delay circuit 241, an address delay circuit 243, and an information update section signal generation circuit 245.

The command pulse delay circuit 241 may output a self-operation pulse RHP as a self-read pulse SRDP. The command pulse delay circuit 241 may delay the self-read pulse SRDP by a command pulse delay time to generate a delay write pulse DWP and a self-write pulse SWTP.

The address delay circuit 243 may output an internal address IADD as a self-read bank address SR_BK. The address delay circuit 243 may delay the self-read bank address SR_BK by an address delay time to generate a self-write bank address SW_BK.

The information update section signal generation circuit 245 may receive the self-read pulse SRDP, the delay write pulse DWP, and the self-write pulse SWTP from the command pulse delay circuit 241. The information update section signal generation circuit 245 may generate an information update section signal RH_EN that is activated during the information update time based on the self-read pulse SRDP, the delay write pulse DWP, and the self-write pulse SWTP. The information update time in which the information update section signal RH_EN is activated may be set as the command pulse delay time.

Figure 19:
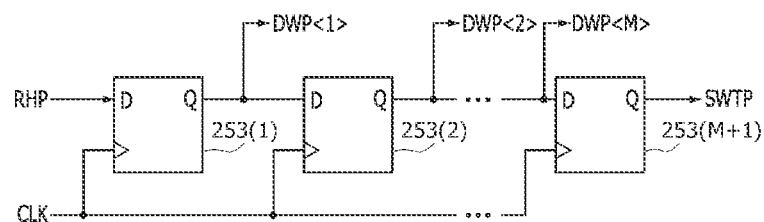
FIGS. 19 and 20 are circuit diagrams illustrating configurations of command pulse delay circuits according to another embodiments of the present disclosure.

FIG. 19 is a circuit diagram illustrating a configuration of a command pulse delay circuit 241A according to an embodiment of the present disclosure. As shown in FIG. 19, the command pulse delay circuit 241A may include first to "M+1"$^{th}$ write command pulse latches 253(1:M+1). The first write command pulse latch 253(1) may latch a self-operation pulse RHP in synchronization with a clock CLK, and output the latched self-operation pulse RHP as a first bit DWP<1>of a delay write pulse DWP. The second write command pulse latch 253(2) may latch the first bit DWP<1>of the delay write pulse DWP in synchronization with the clock CLK, and output the latched first bit DWP<1>of the delay write pulse DWP as a second bit DWP<2>of the delay write pulse DWP. The "M+1"$^{th}$ write command pulse latch 253(M+1) may latch the "M"$^{th}$ bit DWP<M>of the delay write pulse 15 DWP in synchronization with the clock CLK, and output the latched "M"$^{th}$ bit DWP<M>of the delay write pulse DWP as a self-write pulse SWTP. A time in which the self-operation pulses RHP are sequentially latched through the first to "M+1"$^{th}$ write command pulse latches 253(1:M+1) may be set as a command pulse delay time.

Figure 20:
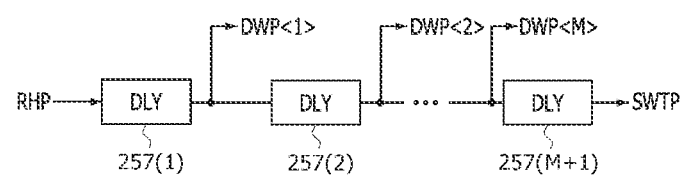

FIG. 20 is a circuit diagram illustrating a configuration of a command pulse delay circuit 241B according to another embodiment of the present disclosure. As shown in FIG. 20, the command pulse delay circuit 241B may include first to "M+1"$^{th}$ write command pulse delay units 257(1:(M+1)). The first write command pulse delay unit 47 257(1) may latch a self-operation pulse RHP in synchronization with a clock CLK, and output the latched self-operation pulse RHP as a first bit DWP<1>of the delay write pulse DWP. The second write command pulse delay unit 257(2) may latch the first bit DWP<1>of the delay write pulse DWP in synchronization with the clock CLK, and output the latched first bit DWP<1>of the delay write pulse DWP as a second bit DWP<2>of the delay write pulse DWP. The "M+1"$^{th}$ write command pulse delay unit 257(M+1) may latch the "M"$^{th}$ bit DWP<M>of the delay write pulse DWP in synchronization with the clock CLK, and output the latched "M"$^{th}$ bit DWP<M>of the delay write pulse DWP as a self-write pulse SWTP. The time interval in which the self-operation pulses RHP are sequentially latched through the first to "M+1"$^{th}$ write command pulse delay units 257(1:M+1) may be set as a command pulse delay time section.

Figure 21:
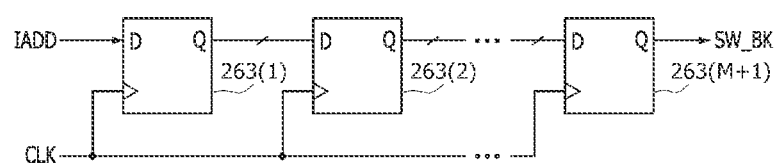
FIGS. 21 and 22 are block diagrams illustrating configurations of address delay circuits according to another embodiments of the present disclosure.

FIG. 21 is a block diagram illustrating a configuration of an address delay circuit 243A according to an embodiment of the present disclosure. As shown in FIG. 21, the address delay circuit 243A may include first to "M+1"$^{th}$ write address latches 263(1:M+1). The address delay circuit 243A may delay an internal address IADD by an 20 address delay time in synchronization with the clock CLK through the first to "M+1"$^{th}$ write address latches 263(1:M+1) to generate a self-write bank address SW_BK.

Figure 22:
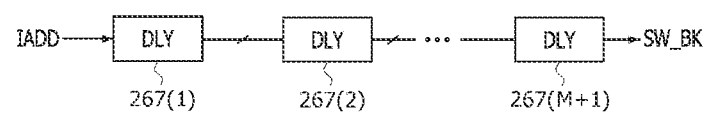

FIG. 22 is a block diagram illustrating a configuration of an address delay circuit 243B according to another embodiment of the present disclosure. As shown in FIG. 22, the address delay circuit 243B may include first to "M+1"$^{th}$ write address delay units 267(1:M+1)). The address delay circuit 243B may delay an internal address IADD by an address delay time in synchronization with the clock CLK through the first to "M+1"$^{th}$ write address delay units 267(1:M+1) to generate a self-write bank address SW_BK.

The operation of the semiconductor device 20 configured as described above will be described with reference to FIGS. 23 and 24.

Figure 23:
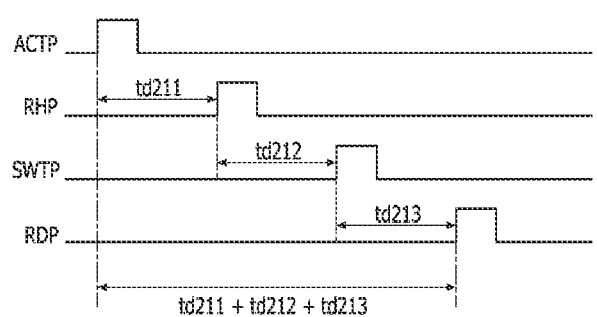
FIGS. 23 and 24 are timing diagrams illustrating an operation of a semiconductor device according to another embodiment of the present disclosure.

As shown in FIG. 23, when an active operation and a read operation are sequentially performed, a self-operation pulse RHP for a self-operation may be generated at a time point when a first time interval td211 elapses from a time when an active pulse ACTP for the active operation is generated, a self-write pulse SWTP for a self-write operation may be generated at a time point when a second time interval td212 elapses from a time when the self-operation pulse RHP is generated, and a read pulse RDP for a read operation may be generated at a time point when a third time interval td213 elapses from the time point when the self-write pulse SWTP is generated. Here, each of the first section td211 and the third time interval td213 may be set to a row address to column address delay tRCD, and the second time interval td212 may be set to the time necessary to generate write data DRHW by increasing a set value of read data DRH_R output from the core circuit (223 of FIG. 17) through a self-read operation and to store the write data DRH_W in the core circuit 223.

Figure 24:
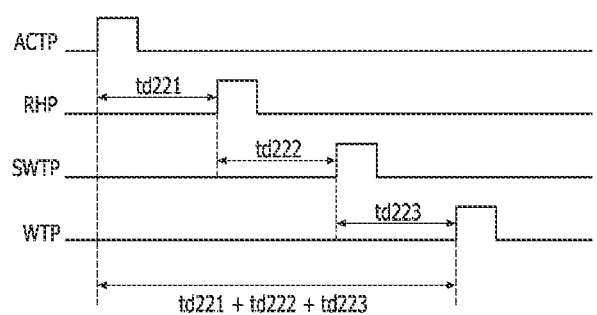

As shown in FIG. 24, when an active operation and a write operation are sequentially performed, a self-operation pulse RHP for a self-operation may be generated at a time point when a first time interval td221 elapses from a time point when an active pulse ACTP for the active operation is generated, a self-write pulse SWTP for a self-write operation may be generated at a time point when a second time interval td222 elapses from a time point when a self-operation pulse RHP is generated, and a write pulse WTP for a write operation may be generated at a time point when a third time interval td223 elapses from the time when the self-write pulse SWTP is generated. Here, each of the first time interval td221 and the third time interval td223 may be set to a row address to column address delay tRCD, and the second time interval td222 may be set to the time necessary to generate the write data DRH_W by increasing the set value of the read data DRH_R output from the core circuit (223 of FIG. 17) through a self-read operation and to store the write data DRH_W in the core circuit 223.

The semiconductor device 20 may sequentially perform a self-read operation and a self-write operation whenever an active operation is performed to update information on the number of times a word line is selected. In addition, the semiconductor device 20 implements the self-read operation and the self-write operation performed whenever the active operation is performed by sharing a column path circuit (the column control circuit 217 in FIG. 17 and the column decoder 221 in FIG. 17) used in a read operation and a write operation for the self-read operation and the self-write operation performed whenever, thereby minimizing area increase due to the addition of a separate circuit. In addition, when updating information about the number of times a word line is selected, the semiconductor device 20 does not include a counter in each of the word lines, but utilizes a counter (not shown) included in the data control circuit 227 shared by the word lines, thereby minimizing an area increase. In addition, the semiconductor device 20 controls the smart refresh operation to be performed when the number of times the word line is selected according to the active operation exceeds a reference value, so that deterioration of data stored in a cell block connected to a target word line and the adjacent word line may be prevented. In addition, the semiconductor device 20 initializes information on the number of times the word line is selected when the refresh operation is performed to prevent the smart refresh operation from being excessively performed, thereby reducing power consumption.

Figure 25:
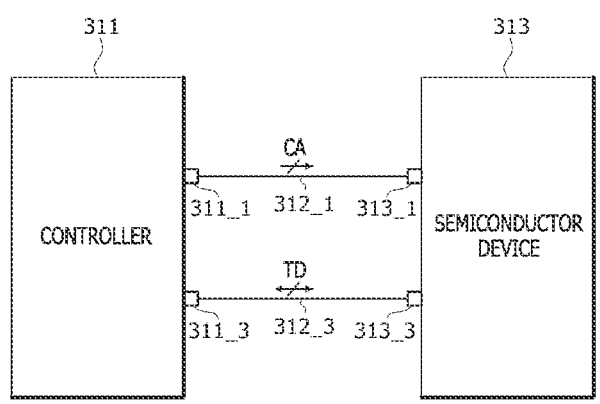
FIG. 25 is a block diagram illustrating a configuration of a semiconductor system according to an embodiment of the present disclosure.

FIG. 25 is a block diagram illustrating a configuration of a semiconductor system 31 according to an embodiment of the present disclosure. As shown in FIG. 25, the semiconductor system 31 may include a controller 311 and a semiconductor device 313.

The controller 311 may include a first control pin 311_1 and a second control pin 311_3. The semiconductor device 313 may include a first device pin 313_1 and a second device pin 313_3. The controller 311 may transmit an external control signal CA to the semiconductor device 313 through a first transmission line 312_1 connected between the first control pin 311_1 and the first device pin 313_1. Each of the first control pin 311_1, the first transmission line 312_1, and the first device pin 313_1 may be implemented in plurality according to the number of bits of the external control signal CA. The controller 311 may apply transmission data TD to the semiconductor device 313 through a second transmission line 312_3 connected between the second control pin 311_3 and the second device pin 313_3. The controller 311 may receive the transmission data TD from the semiconductor device 313 through the second transmission line 312_3 connected between the second control pin 311_3 and the second device pin 313_3.

Whenever an active operation is performed, the semiconductor device 313 may sequentially perform a self-read operation and a self-write operation to update information on the number of times a word line is selected. Whenever the active operation is performed, the semiconductor device 313 may perform the self-read operation and the self-write operation performed through a column path circuit, which are also used in the read operation and the write operation, thereby minimizing the increase in a circuit area for the self-read/self-write operations. In addition, when updating information on the number of times the word line is selected, the semiconductor device 313 utilizes a counter shared by the word lines rather than counters dedicated to the respective word lines, thereby minimizing the increase in area. In addition, the semiconductor device 313 may perform a smart refresh operation when the number of times the word line is selected according to the active operation exceeds a reference value, thereby preventing deterioration of data stored in the cell blocks connected to the target word line and the adjacent word lines. When the refresh operation is performed, the semiconductor device 313 may initialize information on the number of times the word line is selected, thereby preventing the smart refresh operation from being excessively performed and reducing power consumption.

Figure 26:
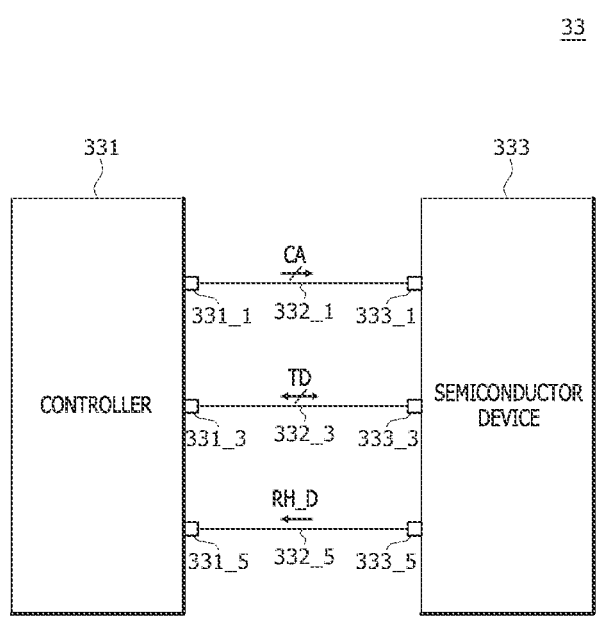
FIG. 26 is a block diagram illustrating a configuration of a semiconductor system according to another embodiment of the present disclosure.

FIG. 26 is a block diagram illustrating a configuration of a semiconductor system 33 according to an embodiment of the present disclosure. As shown in FIG. 26, the semiconductor system 33 may include a controller 331 and a semiconductor device 333.

The controller 331 may include a first control pin 331_1, a second control pin 331_3, and a third control pin 331_5. The semiconductor device 333 may include a first device pin 333_1, a second device pin 333_3, and a third device pin 333_5. The controller 331 may transmit an external control signal CA to the semiconductor device 333 through a first transmission line 332_1 connected between the first control pin 331_1 and the first device pin 333_1. The controller 331 may apply transmission data TD to the semiconductor device 333 through a second transmission line 332_3 connected between the second control pin 331_3 and the second device pin 333_3. The controller 331 may receive the transmission data TD from the semiconductor device 333 through the second transmission line 332_3 connected between the second control pin 331_3 and the second device pin 333_3. The semiconductor device 333 may apply a detection flag RH_D to the controller 331 through a third transmission line 332_5 connected between the third device pin 333_5 and the third control pin 331_5.

The semiconductor device 313 may generate a detection flag RH_D that is activated when the number of times a word line is selected according to an active operation exceeds a reference value based on the external control signal CA. The controller 331 may apply the external control signal CA to the semiconductor device 333 in order to control semiconductor device 333 to perform a smart refresh operation when the detection flag RH_D is received and the detection flag RH_D is activated. The semiconductor device 333 may sequentially perform a self-read operation and a self-write operation whenever an active operation is performed according to the external control signal CA to update information on the number of times a word line is selected. In addition, the semiconductor device 333 may implement the self-read operation and the self-write operation performed whenever the active operation is performed according to the external control signal CA by sharing a column path circuit used in a read operation and a write operation. In addition, when updating the information on the number of times a word line is selected based on the external control signal CA, the semiconductor device 333 may not include a counter in each of the word lines, but may use a counter shared by the word lines. In addition, the semiconductor device 313 may initialize the information on the number of times a word line is selected when a refresh operation is performed according to the external control signal CA.

The semiconductor device 10 shown in FIG. 1, the semiconductor device 20 shown in FIG. 17, the semiconductor device 313 shown in FIG. 25, and the semiconductor device 333 shown in FIG. 26 may be applied to an electronic system including a memory system, a graphic system, a computing system, and a mobile system. For example, referring to FIG. 27, an electronic system 1000 according to an embodiment of the present disclosure may include a data storage unit 1001, a memory controller 1002, a buffer memory device (hereinafter, buffer memory) 1003, and an input/output interface 1004.

The data storage unit 1001 may store data (not shown) that is applied from the memory controller 1002 according to a control signal from the memory controller 1002, read the stored data (not shown), and output the data to the memory controller 1002. Meanwhile, the data storage unit 1001 may include a non-volatile memory capable of continuously storing data without losing data even when power is cut off. The non-volatile memory may be implemented with flash memory (NOR flash memory, NAND flash memory), phase change random access memory (PRAM), resistive random access memory (RRAM), spin transfer torque random access memory (STTRAM), or magnetic random access memory (MRAM).

Figure 27:
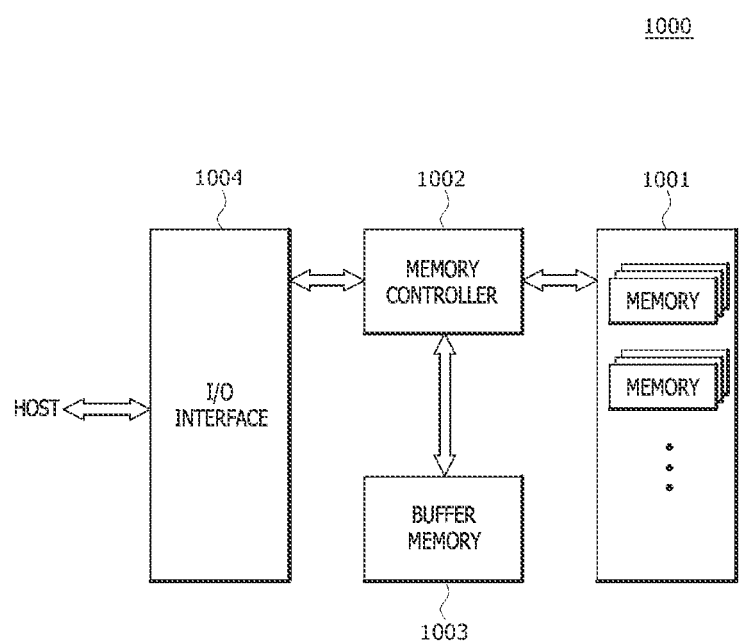
FIG. 27 is a block diagram illustrating a configuration of an electronic system according to an embodiment of the present disclosure.

The memory controller 1002 may decode a command applied from an external device (host device) through the input/output interface 1004, and control data input/output to the data storage unit 1001 and the buffer memory 1003 according to a result of decoding. In FIG. 27, the memory controller 1002 is shown as one block, but the memory controller 1002 may include a controller for controlling the data storage unit 1001 and a controller for controlling the buffer memory 1003 which is a volatile memory device independently. The memory controller 1002 may include the controller 311 shown in FIG. or the controller 331 shown in FIG. 26.

The buffer memory 1003 may temporarily store the data to be processed by the memory controller 1002, that is, data input/output to the data storage unit 1001 (not shown). The buffer memory 1003 may store data (not shown) applied from the memory controller 1002 according to a control signal. The buffer memory device 1003 may include the semiconductor device 10 shown in FIG. 1, the semiconductor device 20 shown in FIG. 17, the semiconductor device 313 shown in FIG. 25, or the semiconductor device 333 shown in FIG. 26. The buffer memory 1003 may read the stored data and output the data to the memory controller 1002. The buffer memory 1003 may include volatile memory such as dynamic random access memory (DRAM), mobile DRAM, or static random access memory (SRAM).

The input/output interface 1004 may provide a physical connection between the memory controller 1002 and an external device (host) so that the memory controller 1002 may receive a control signal for data input/output from an external device and exchange data with the external device. The input/output interface 1004 may include one of various interface protocols such as USB, MMC, PCI-E, SAS, SATA, PATA, SCSI, ESDI, and IDE.

The electronic system 1000 may be used as an auxiliary storage device or an external storage device of the host device. The electronic system 1000 may include a solid state disk (SSD), universal serial bus memory (USB), a secure digital card (SD), a mini secure digital card (mSD), a micro secure digital card (micro SD), secure digital high capacity (SDHC), a memory stick card, a smart media card (SM), a multi media card (MMC), an embedded multimedia card (EMMC), a compact flash card (CF), and the like.

Figure 28:
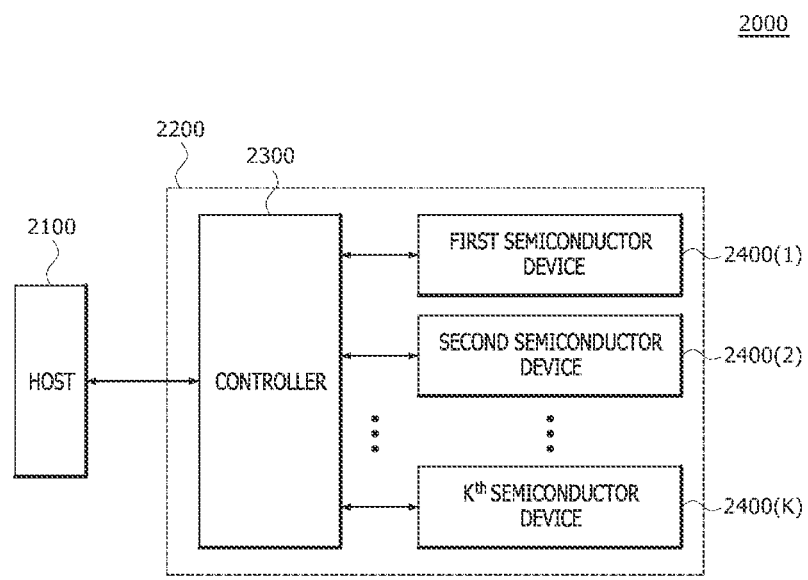
FIG. 28 is a block diagram illustrating a configuration of an electronic system according to another embodiment of the present disclosure.

FIG. 28 is a block diagram illustrating a configuration of an electronic system 2000 according to another embodiment of the present disclosure. As shown in FIG. 28, the electronic system 2000 may include a host 2100 and a semiconductor system 2200.

The host 2100 and the semiconductor system 2200 may transmit signals to each other using an interface protocol. The interface protocol used between the host 2100 and the semiconductor system 2200 may include a multi-media card (MMC), an enhanced small disk interface (ESDI), integrated drive electronics (IDE), peripheral component interconnect-express (PCI-e or PCIe), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). Each of the semiconductor devices 2400(1:K) may sequentially perform a self-read operation and a self-write operation whenever an active operation is performed to update information on the number of times a word line is selected. Each of the semiconductor devices 2400(1:K) may implement a self-read operation and a self-write operation performed whenever the active operation is performed by sharing a column path circuit used in a read operation and a write operation. Each of the semiconductor devices 2400(1:K) may control such that the smart refresh operation is performed when the number of times the word line is selected according to the active operation exceeds a reference value. Each of the semiconductor devices 2400(1:K) may initialize information on the number of times a word line is selected when a refresh operation is performed.

Each of the semiconductor devices 2400(1:K) may include the semiconductor device 10 shown in FIG. 1, the semiconductor device shown in FIG. 17, the semiconductor device 313 shown in FIG. 25, or the semiconductor device 333 shown in FIG. 26. Each of the semiconductor devices 2400(1:K) may be implemented with one of dynamic random access memory (DRAM), phase change random access memory (PRAM), resistive random access memory (RRAM), magnetic random access memory (MRAM), and ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts. Furthermore, the embodiments may be combined to form additional embodiments.

What is claimed is:

1. A semiconductor device comprising:
    an information update control circuit configured to generate a self-read pulse for a self-read operation, a self-write pulse for a self-write operation, and an information update section signal that is activated during an information update time interval when an active operation is performed; and
    a column control circuit configured to:
        generate a read column strobe pulse for outputting data or selection information data, which is stored in a core circuit, when the self-read operation is performed according to the self-read pulse or when a read operation is performed according to a read pulse, and
        generate a write column strobe pulse for storing the data or the selection information data in the core circuit when the self-write operation is performed according to the self-write pulse or when a write operation is performed according to a write pulse.

2. The semiconductor device of claim 1, wherein the information update control circuit comprises a command pulse delay circuit configured to
    generate a delay read pulse and the self-read pulse based on an active pulse generated when the active operation is performed, and
    generate a delay write pulse and the self-write pulse based on the self-read pulse.

3. The semiconductor device of claim 2, wherein the command pulse delay circuit comprises:
    a first command pulse delay circuit configured to delay the active pulse by a first command pulse delay time to generate the self-read pulse; and
    a second command pulse delay circuit configured to delay the self-read pulse by a second command pulse delay time to generate the self-write pulse.

4. The semiconductor device of claim 3,
    wherein the first command pulse delay time is set to a row address to column address delay (tRCD), and
    wherein the second command pulse delay time is set as a time necessary to generate write data by increasing a set value of read data output during the self-read operation and to store the write data in the core circuit.

5. The semiconductor device of claim 3, wherein the first command pulse delay circuit comprises a read command pulse latch or a read command pulse delay unit configured to sequentially delay the active pulse to generate the delay read pulse.

6. The semiconductor device of claim 5, wherein the second command pulse delay circuit comprises a write command pulse latch or a write command pulse delay unit configured to sequentially delay the self-read pulse to generate the delay write pulse.

7. The semiconductor device of claim 3, wherein the information update control circuit further comprises:
    a first address delay circuit configured to delay an internal address by a first address delay time to generate a self-read bank address; and
    a second address delay circuit configured to delay the self-read bank address by a second address delay time to generate a self-write bank address.

8. The semiconductor device of claim 7, wherein the first command pulse delay time is set to be the same as the first address delay time, and wherein the second command pulse delay time is set to be the same as the second address delay time.

9. The semiconductor device of claim 3, wherein the information update control circuit further comprises an information update section signal generation circuit configured to generate the information update section signal based on the active pulse, the delay read pulse, the self-read pulse, the delay write pulse, and the self-write pulse.

10. The semiconductor device of claim 9,
    wherein the information update section signal generation circuit is configured to generate the information update section signal that is activated during the information update time interval, and
    wherein the information update time interval is a sum of the first command pulse delay time and the second command pulse delay time.

11. The semiconductor device of claim 1,
    wherein the core circuit comprises a first cell block and a second cell block,
    wherein the first cell block and the second cell block are connected to a same word line, and
    wherein the first cell block is connected to bit lines different from bit lines connected to the second cell block.

12. The semiconductor device of claim 11,
    wherein the data received through a data line is stored in the first cell block in the write operation,
    wherein the data stored in the first cell block is output through the data line in the read operation,
    wherein write data received through the data line is stored in the second cell block as the selection information data in the self-write operation, and
    wherein the selection information data stored in the second cell block is output as read data through the data line in the self-read operation.

13. The semiconductor device of claim 12, wherein the selection information data comprises information on a number of times a word line is selected according to the active operation.

14. The semiconductor device of claim 11, further comprising a column decoder configured to generate, based on the information update section signal, the read column strobe pulse, and the write column strobe pulse, one of a first column selection signal for selecting at least one of first bit lines connected to the first cell block and a second column selection signal for selecting at least one of second bit lines connected to the second cell block.

15. The semiconductor device of claim 14, wherein the column decoder is configured to
generate the first column selection signal when the read operation or the write operation is performed, and
generate the second column selection signal when the self-read operation or the self-write operation is performed.

16. The semiconductor device of claim 1, further comprising a data control circuit configured to
increase a set value of read data output from cell block when the self-read operation is performed, and
generate write data having the increased set value when the self-write operation is performed.

17. The semiconductor device of claim 16, wherein the data control circuit comprises:
a counting pulse generation circuit configured to generate a counting pulse that is activated when the self-read operation is performed according to the information update section signal and the read column strobe pulse;
a counter configured to increase the set value of the read data based on the counting pulse to output counting data; and
a write data output circuit configured to output the counting data as the write data when the self-write operation is performed according to the write column strobe pulse.

18. A semiconductor device comprising:
a core circuit including a first cell block and a second cell block connected to word lines;
a column control circuit configured to:
generate a read column strobe pulse for outputting data or selection information data, which is stored in the core circuit, when a self-read operation is performed according to an active pulse or when a read operation is performed according to a read pulse, and
generate a write column strobe pulse for storing the data or the selection information data in the core circuit when a self-write operation is performed according to the active pulse or when a write operation is performed according to a write pulse; and
a column decoder configured to generate, based on the read column strobe pulse, the write column strobe pulse and an information update section signal, one of a first column selection signal for selecting at least one of first bit lines connected to the first cell block and a second column selection signal for selecting at least one of second bit lines connected to the second cell block.

19. The semiconductor device of claim 18, wherein the selection information data comprises information on a number of times a word line is selected according to an active operation.

20. The semiconductor device of claim 18,
wherein the data received through a data line is stored in the first cell block in the write operation,
wherein the data stored in the first cell block is output through the data line in the read operation,
wherein write data received through the data line is stored in the second cell block as the selection information data in the self-write operation, and
wherein the selection information data stored in the second cell block is output as read data through the data line in the self-read operation.

21. The semiconductor device of claim 18, wherein the column decoder is configured to
generate the first column selection signal when the read operation or the write operation is performed, and
generate the second column selection signal when the self-read operation or the self-write operation is performed.

22. The semiconductor device of claim 18, further comprising a data control circuit configured to
increase a set value of read data output from the second cell block when the self-read operation is performed, and
generate write data having the increased set value when the self-write operation is performed.

23. The semiconductor device of claim 22, wherein the data control circuit comprises:
a counting pulse generation circuit configured to generate a counting pulse that is activated when the self-read operation is performed according to the information update section signal and the read column strobe pulse;
a counter configured to increase the set value of the read data based on the counting pulse to output counting data; and
a write data output circuit configured to output the counting data as the write data when the self-write operation is performed according to the write column strobe pulse.

24. A semiconductor device comprising:
an information update control circuit configured to generate, based on a self-operation pulse generated at a time point when a preset time interval elapses from a time point when an active pulse is generated, a self-read pulse for a self-read operation, a self-write pulse for a self-write operation, and an information update section signal that is activated during an information update time interval; and
a column control circuit configured to:
generate a read column strobe pulse for outputting data or selection information data, which is stored in a core circuit, when the self-read operation is performed according to the self-read pulse or when a read operation is performed according to a read pulse, and
generate a write column strobe pulse for storing the data or the selection information data in the core circuit when the self-write operation is performed according to the self-write pulse or when a write operation is performed according to a write pulse.

25. The semiconductor device of claim 24,
further comprising a control signal decoder configured to decode an external control signal to generate the active pulse for an active operation,
wherein the control signal decoder is configured to generate the self-operation pulse at a time point when a row address to column address delay (tRCD) section elapses from a time point at which the active pulse is generated.

26. The semiconductor device of claim 25, wherein the information update control circuit comprises a command pulse delay circuit configured to output the self-operation pulse as the self-read pulse, and generate a delay write pulse and the self-write pulse based on the self-operation pulse.

27. The semiconductor device of claim 26, wherein the command pulse delay circuit is configured to delay the self-operation pulse by a command pulse delay time to generate the self-write pulse.

28. The semiconductor device of claim 26, wherein the command pulse delay circuit comprises a write command pulse latch or a write command pulse delay unit configured to sequentially delay the self-operation pulse to generate the delay write pulse.

29. The semiconductor device of claim 27, wherein the information update control circuit further comprises an address delay circuit configured to output an internal address as a self-read bank address, and delay the internal address by an address delay time to generate a self-write bank address.

30. The semiconductor device of claim 29, wherein the command pulse delay time is set to be the same as the address delay time.

31. The semiconductor device of claim 26, further comprising an information update section signal generation circuit configured to generate the information update section signal based on the self-operation pulse, the delay write pulse, and the self-write pulse.

* * * * *